US012081890B2

(12) United States Patent
Kusuda

(10) Patent No.: US 12,081,890 B2
(45) Date of Patent: Sep. 3, 2024

(54) IMAGING DEVICE

(71) Applicant: Sony Semiconductor Solutions Corporation, Kanagawa (JP)

(72) Inventor: Junichiro Kusuda, Kumamoto (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 65 days.

(21) Appl. No.: 17/907,809

(22) PCT Filed: Mar. 12, 2021

(86) PCT No.: PCT/JP2021/010226
§ 371 (c)(1),
(2) Date: Aug. 29, 2022

(87) PCT Pub. No.: WO2021/193168
PCT Pub. Date: Sep. 30, 2021

(65) Prior Publication Data
US 2023/0104160 A1 Apr. 6, 2023

(30) Foreign Application Priority Data

Mar. 24, 2020 (JP) .................. 2020-052229

(51) Int. Cl.
*H04N 25/772* (2023.01)
*H03F 3/45* (2006.01)
(Continued)

(52) U.S. Cl.
CPC ....... *H04N 25/772* (2023.01); *H03F 3/45269* (2013.01); *H03M 1/38* (2013.01);
(Continued)

(58) Field of Classification Search
CPC ...... H04N 25/772; H04N 25/78; H04N 25/75; H04N 25/76; H04N 25/616; H04N 25/767;
(Continued)

(56) References Cited

U.S. PATENT DOCUMENTS 8,760,213 B2 * 6/2014 Saito .................. H03K 4/50
341/169
2006/0001476 A1 * 1/2006 Yanagisawa ........... G05F 3/262
327/538
(Continued)

FOREIGN PATENT DOCUMENTS

CN 1917374 A 9/2014
EP 1742369 A2 9/2015
(Continued)

OTHER PUBLICATIONS

International Search Report (PCT/ISA/210), International Application No. PCT/JP2021/010226, dated Jun. 15, 2021.

*Primary Examiner* — Abdelaaziz Tissire
(74) *Attorney, Agent, or Firm* — Michael Best & Friedrich LLP

(57) ABSTRACT

An imaging device of the present disclosure includes: a plurality of pixel circuits that each generates a pixel signal including a pixel voltage corresponding to an amount of received light, and performs AD conversion by comparing the pixel signal with a reference signal; and a reference signal generator including a signal generation circuit and a voltage follower circuit, the signal generation circuit that generates a voltage signal having a ramp waveform, and the voltage follower circuit that performs a voltage follower operation on the basis of the voltage signal to generate the reference signal, and supplies the reference signal to the plurality of pixel circuits.

8 Claims, 14 Drawing Sheets

(51) Int. Cl.
*H03M 1/38* (2006.01)
*H04N 25/78* (2023.01)

(52) U.S. Cl.
CPC ....... *H04N 25/78* (2023.01); *H03F 2200/129* (2013.01); *H03F 2200/135* (2013.01)

(58) Field of Classification Search
CPC ...... H04N 25/00; H04N 25/60; H04N 25/745; H04N 25/77; H04N 25/62; H04N 23/741; H04N 25/57; H04N 25/575; H04N 25/63; H04N 25/671; H04N 17/002; H04N 25/617; H04N 25/627; H04N 25/65; H04N 25/709; H04N 23/76; H04N 25/134; H04N 25/40; H04N 25/583; H04N 25/677; H04N 25/766; H04N 3/155; H04N 23/73; H04N 25/42; H04N 25/50; H04N 25/571; H04N 25/587; H04N 25/589; H04N 25/59; H04N 25/70; H04N 25/74; H04N 25/778; H04N 23/667; H04N 23/70; H04N 23/81; H04N 23/843; H04N 25/44; H04N 25/46; H04N 25/47; H04N 25/533; H04N 25/621; H04N 25/622; H04N 25/672; H04N 25/71; H04N 25/73; H04N 25/771; H04N 25/779; H04N 25/79; H04N 3/1512; H04N 3/1568; H04N 5/202; H04N 5/265; H03F 3/45269; H03F 2200/129; H03F 2200/135; H03F 2203/45124; H03F 3/3028; H03F 3/45183; H03F 3/45192; H03M 1/38; H03M 1/123; H03M 1/56
See application file for complete search history.

(56) References Cited

U.S. PATENT DOCUMENTS

| | | |
|---|---|---|
| 2007/0008206 A1 | 1/2007 | Tooyama |
| 2010/0033362 A1* | 2/2010 | Kitami ................. H04N 25/447 341/169 |
| 2012/0119063 A1* | 5/2012 | Takamiya ............ H04N 17/002 250/208.1 |
| 2016/0205333 A1 | 7/2016 | Shishido |
| 2017/0064237 A1* | 3/2017 | Aibara ................. H04N 25/583 |
| 2019/0281246 A1* | 9/2019 | Kim ..................... H04N 25/745 |

FOREIGN PATENT DOCUMENTS

| | | | |
|---|---|---|---|
| JP | 2005278135 A | | 10/2005 |
| JP | 2006350754 A | * | 12/2006 |
| JP | 2007019682 A | | 1/2007 |
| KR | 20070005508 A | | 1/2007 |
| WO | 2015079597 A1 | | 6/2015 |

* cited by examiner

[ FIG. 2 ]

[ FIG. 4 ]
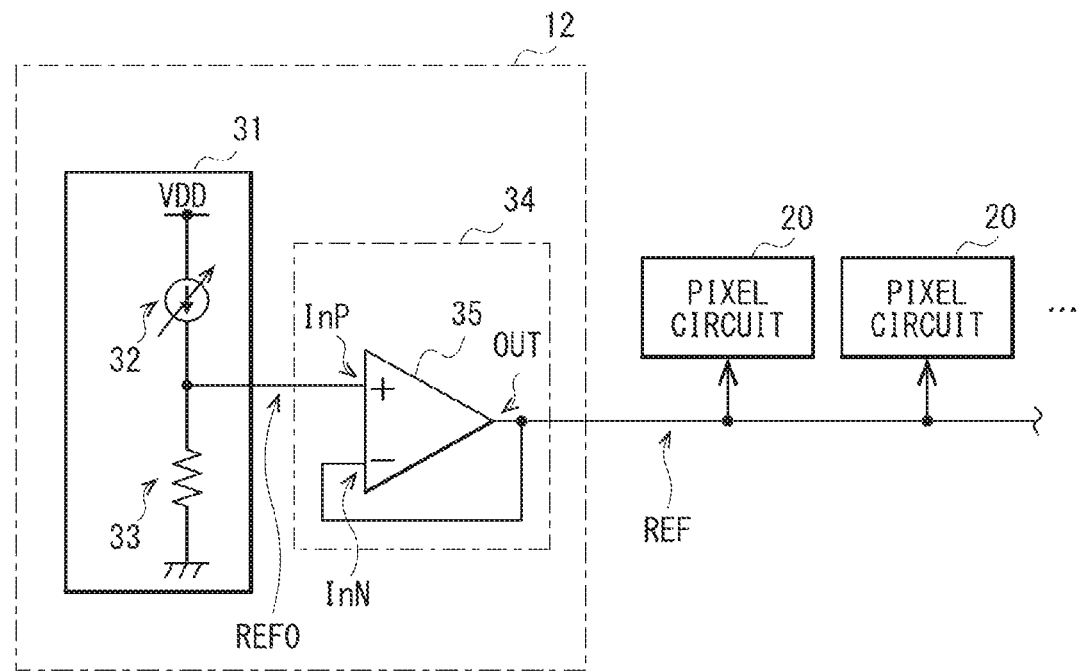
[ FIG. 5 ]
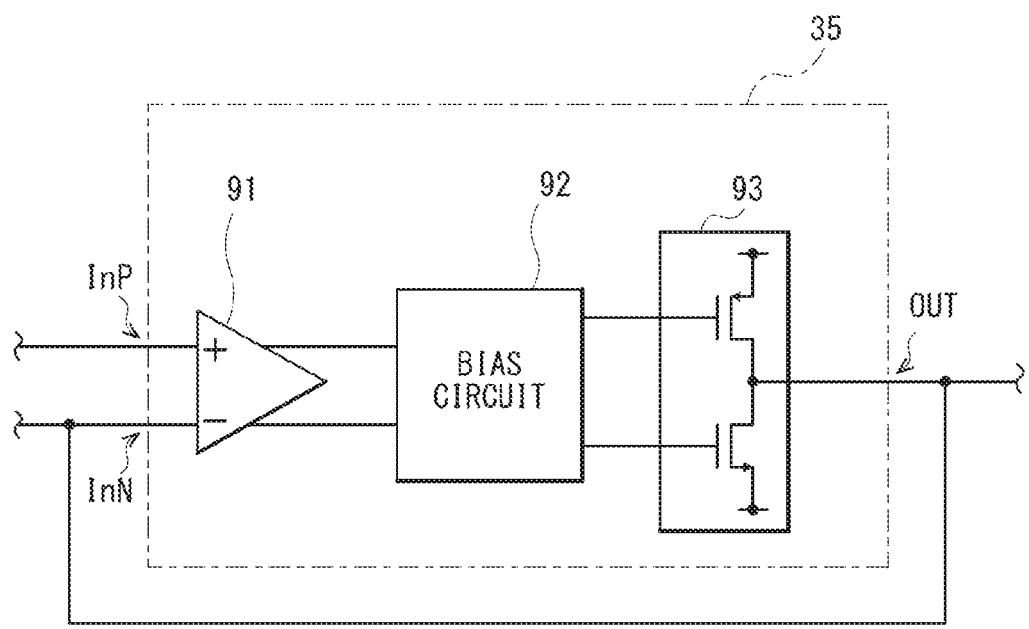

[FIG. 9]
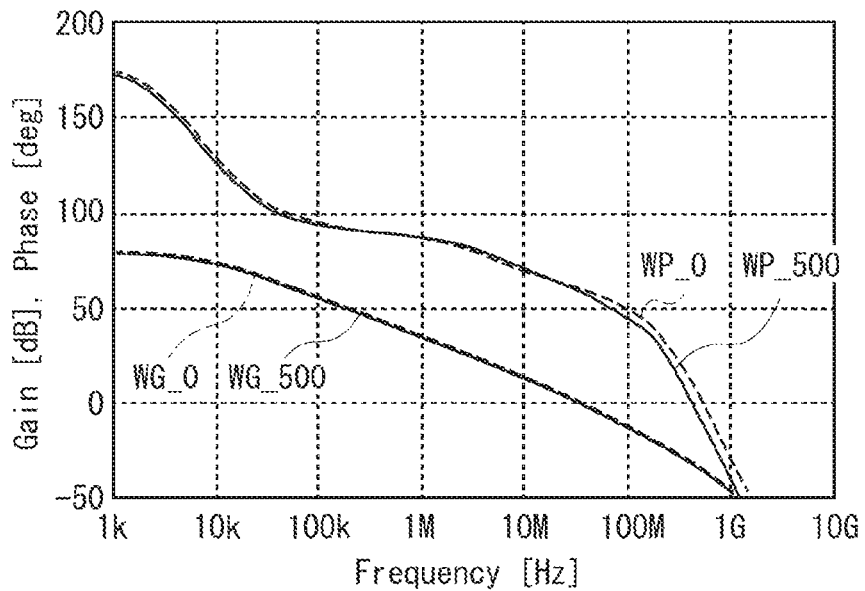
[FIG. 10]
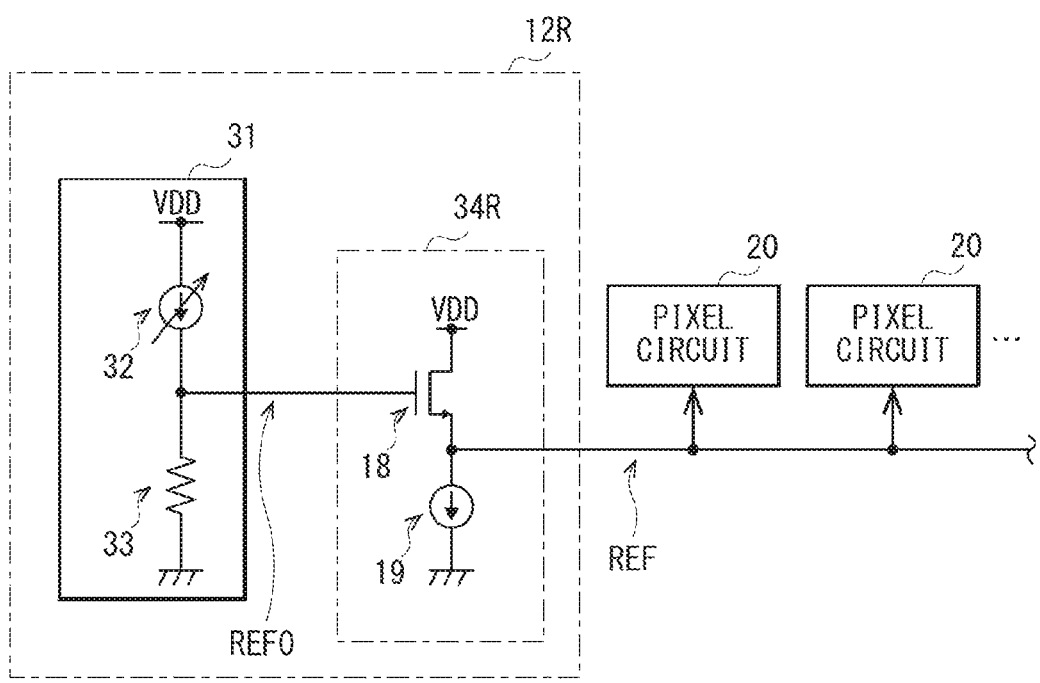

[ FIG. 16 ]
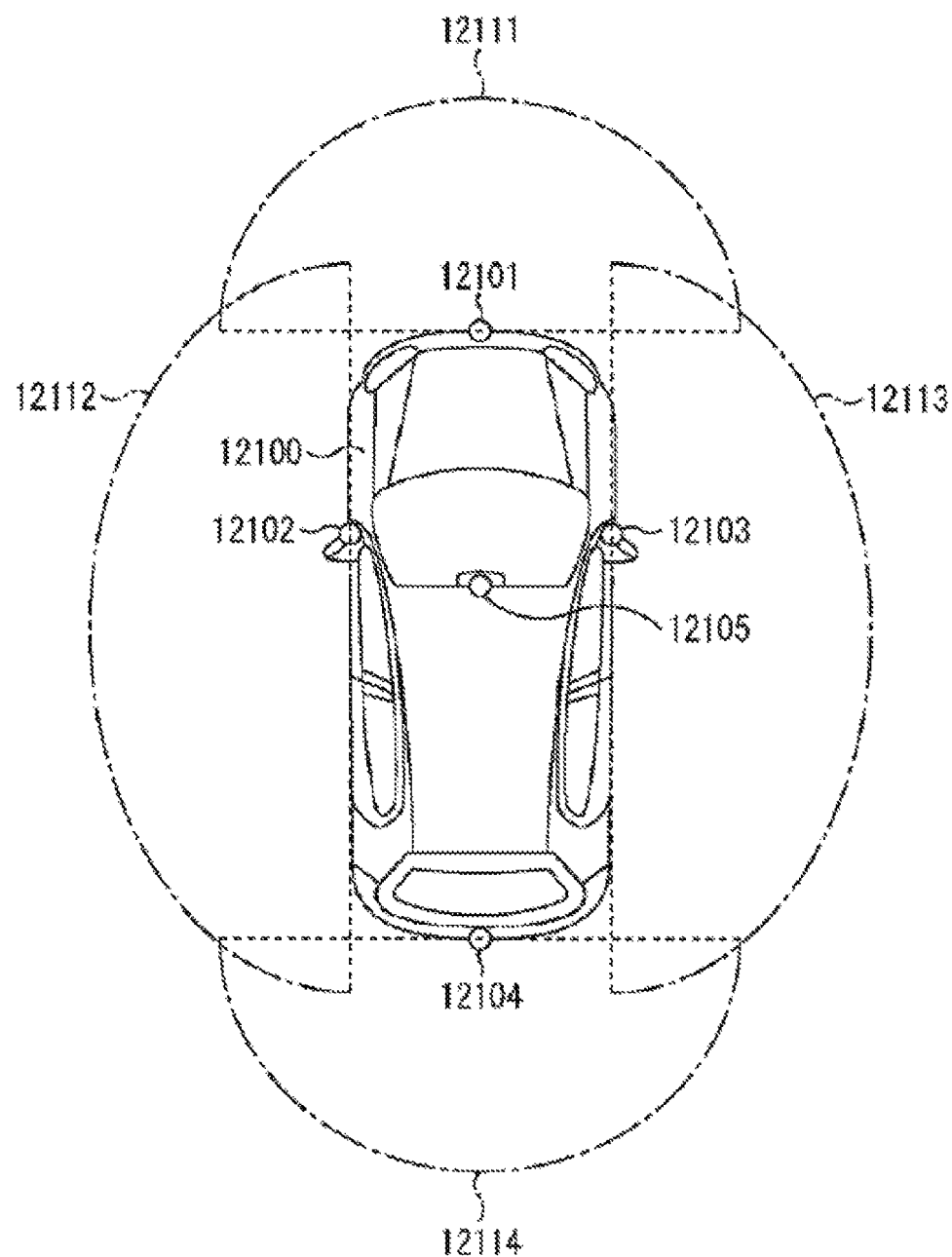

IMAGING DEVICE

TECHNICAL FIELD

The present disclosure relates to an imaging device that images a subject.

BACKGROUND ART

In general, in an imaging device, pixels each including a photodiode are arranged in a matrix form, and each of the pixels generates a pixel voltage corresponding to an amount of received light. For example, an AD conversion circuit (Analog to Digital Converter) then converts the pixel voltage (analog signal) into a digital signal. For example, PTL 1 discloses an imaging device that performs AD conversion by comparing a signal including a pixel voltage with a reference signal having a ramp waveform.

CITATION LIST

Patent Literature

PTL 1: Japanese Unexamined Patent Application Publication No. 2005-278135

SUMMARY OF THE INVENTION

Incidentally, imaging devices are desired to offer captured images having high image quality and expected to have further improved image quality.

It is desirable to provide an imaging device that makes it possible to enhance image quality of a captured image.

An imaging device according to an embodiment of the present disclosure includes a plurality of pixel circuits and a reference signal generator. The plurality of pixel circuits is configured to each generate a pixel signal including a pixel voltage corresponding to an amount of received light, and perform AD conversion by comparing the pixel signal with a reference signal. The reference signal generator includes a signal generation circuit and a voltage follower circuit. The signal generation circuit generates a voltage signal having a ramp waveform, and the voltage follower circuit performs a voltage follower operation on the basis of the voltage signal to generate the reference signal, and supplies the reference signal to the plurality of pixel circuits.

In the imaging device according to the embodiment of the present disclosure, in each of the plurality of pixel circuits, the voltage signal having a ramp waveform is generated, and the voltage follower operation is performed on the basis of the voltage signal to generate the reference signal. Then, in each of the plurality of pixel circuits, the pixel signal including the pixel voltage corresponding to the amount of received light is generated, and the AD conversion is performed by comparing the pixel signal with the reference signal. The generated reference signal is supplied to the plurality of pixel circuits.

BRIEF DESCRIPTION OF DRAWINGS

FIG. 4 is a circuit diagram illustrating a configuration example of a reference signal generator illustrated in FIG. 1.

FIG. 5 is a block diagram illustrating a configuration example of an amplifier illustrated in FIG. 4.

FIG. 9 is an explanatory diagram illustrating a characteristic example of a voltage follower circuit illustrated in FIG. 4.

FIG. 10 is a circuit diagram illustrating a configuration example of a reference signal generator according to a comparative example.

FIG. 16 is a diagram of assistance in explaining an example of installation positions of an outside-vehicle information detecting section and an imaging section.

MODES FOR CARRYING OUT THE INVENTION

In the following, some embodiments of the present disclosure are described in detail with reference to the drawings. It is to be noted that description is given in the following order.
1. Embodiment
2. Usage Example of Imaging Device
3. Example of Application to Mobile Body

1. Embodiment

Configuration Example

Figure 1:
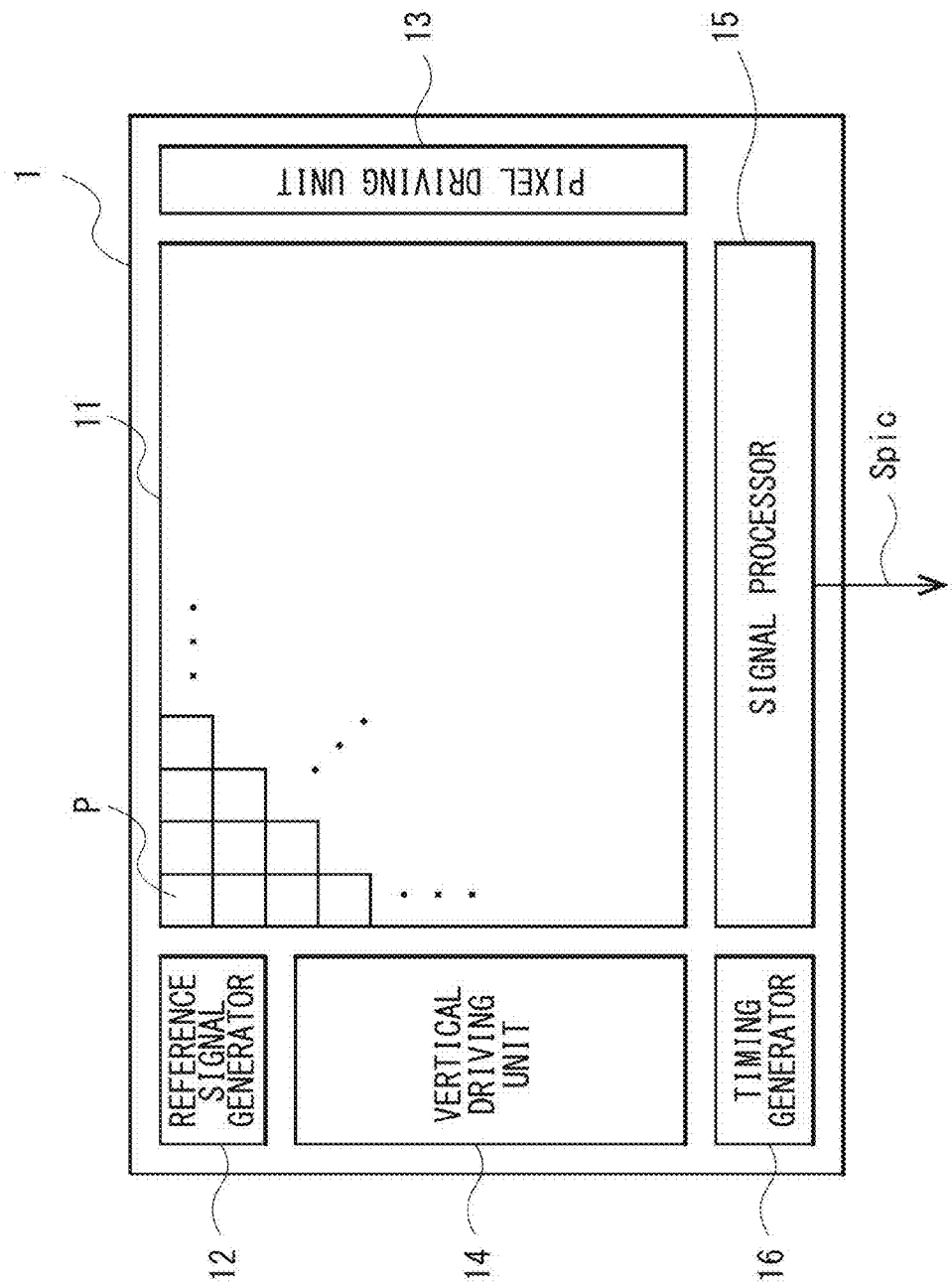
FIG. 1 is a block diagram illustrating a configuration example of an imaging device according to an embodiment of the present disclosure.

FIG. 1 illustrates a configuration example of an imaging device (imaging device 1) according to an embodiment. The imaging device 1 includes a pixel array 11, a reference signal generator 12, a pixel driving unit 13, a vertical driving unit 14, a signal processor 15, and a timing generator 16.

The pixel array 11 includes a plurality of pixels P arranged in a matrix form. Each of the pixels P includes a photodiode PD, and is configured to generate a pixel signal SIG including a pixel voltage Vpix corresponding to an amount of received light and perform AD conversion on the basis of the pixel signal SIG. The pixels P are disposed over two semiconductor substrates.

Figure 2:
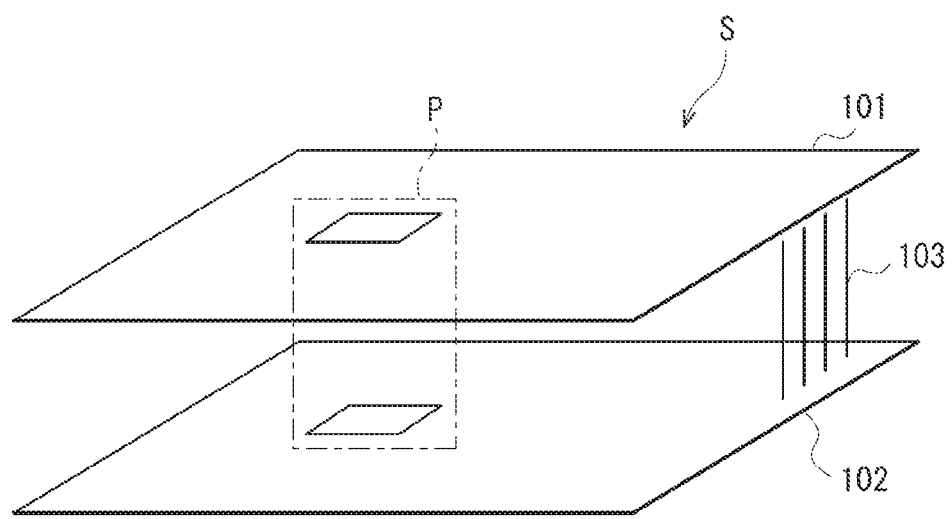
FIG. 2 is a schematic view of an implementation example of the imaging device illustrated in FIG. 1.

FIG. 2 illustrates an implementation example of the imaging device 1. In this example, the imaging device 1 is formed on semiconductor substrates 101 and 102. The semiconductor substrate 101 is disposed on imaging surface side in the imaging device 1, and the semiconductor substrate 102 is disposed on side opposite to the imaging surface side of the imaging device 1. The semiconductor substrates 101 and 102 are superimposed on each other. A wiring line of the semiconductor substrate 101 and a wiring line of the semiconductor substrate 102 are coupled to each other by a wiring line 103. It is possible to use, for example, a metallic bond such as Cu—Cu for the wiring line 103. The pixels P are disposed over these two semiconductor substrates 101 and 102.

Figure 3:
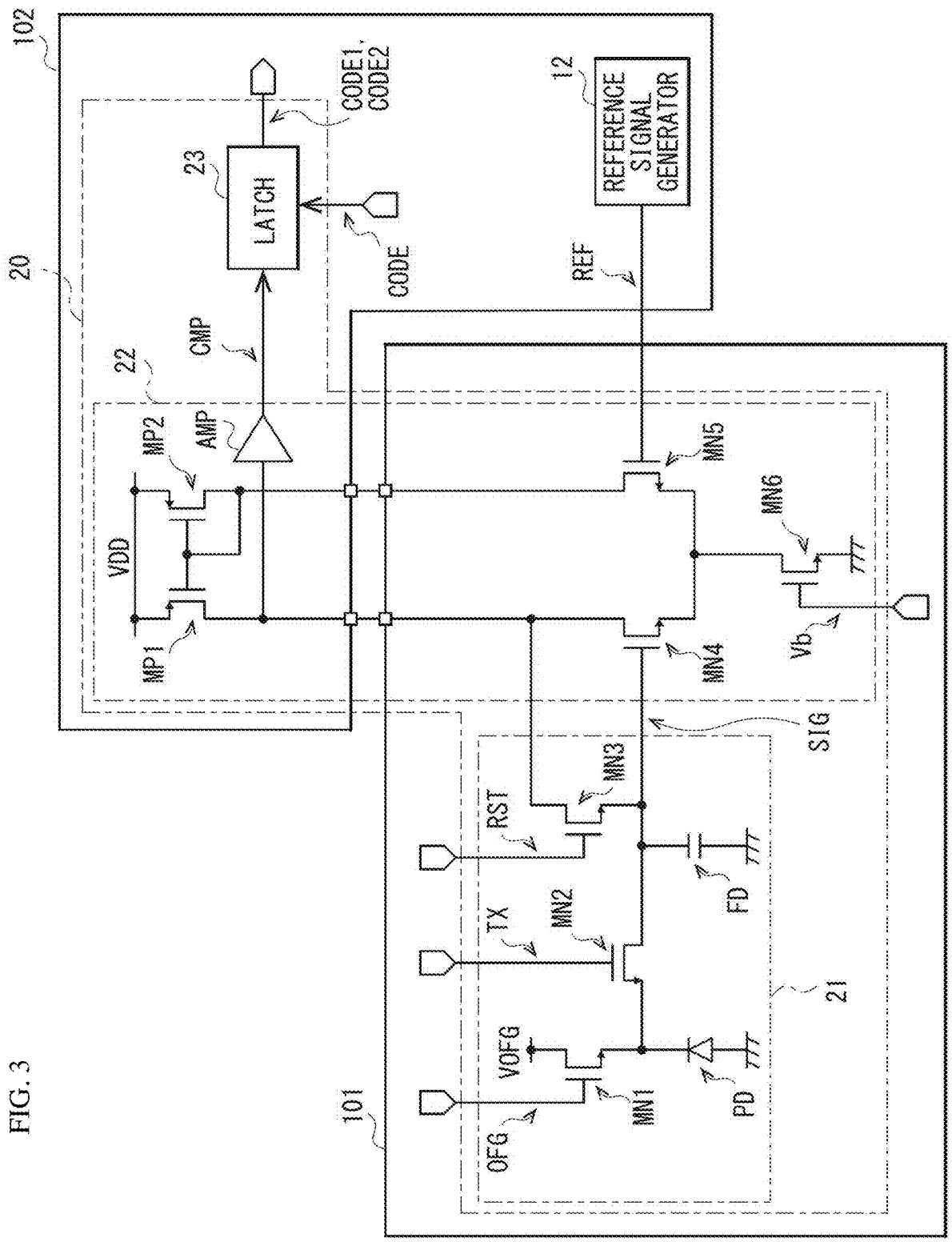
FIG. 3 is a circuit diagram illustrating a configuration example of a pixel circuit included in a pixel illustrated in FIG. 1.

FIG. 3 illustrates a configuration example of the pixel P. The pixel P includes a pixel circuit 20. The pixel circuit 20 includes a light-receiving circuit 21, a comparison circuit 22, and a latch 23.

The light-receiving circuit 21 is configured to generate the pixel voltage Vpix corresponding to the amount of received light. The light-receiving circuit 21 is disposed on the semiconductor substrate 101. The light-receiving circuit 21 includes a photodiode PD, a discharge transistor MN1, a transfer transistor MN2, a floating diffusion FD, and a reset transistor MN3. The discharge transistor MN1, the transfer transistor MN2, and the reset transistor MN3 are N-type MOS (Metal Oxide Semiconductor) transistors.

The photodiode PD is a photoelectric conversion element that generates and accumulates electric charges in an amount corresponding to the amount of received light. The photodiode PD has an anode grounded, and a cathode coupled to a source of the discharge transistor MN1 and a source of transfer transistor MN2.

The discharge transistor MN1 has a gate supplied with a control signal OFG supplied from the pixel driving unit 13 (FIG. 1), a drain supplied with a voltage VOFG, and the source coupled to the cathode of the photodiode PD and the source of the transfer transistor MN2.

The transfer transistor MN2 has a gate supplied with a control signal TX supplied from the pixel driving unit 13 (FIG. 1), the source coupled to the cathode of the photodiode PD and the source of the discharge transistor MN1, and a drain coupled to the floating diffusion FD, a source of the reset transistor MN3, and a gate of a transistor MN4 (to be described later) in the comparison circuit 22.

The floating diffusion FD is configured to accumulate electric charges transferred from the photodiode PD. The floating diffusion FD includes, for example, a diffusion layer formed on a surface of the semiconductor substrate 101. FIG. 3 illustrates the floating diffusion FD by using a symbol of a capacitor.

The reset transistor MN3 has agate supplied with a control signal RST, a drain coupled to a drain of the transistor MN4 (to be described later) of the comparison circuit 22, and the source coupled to the floating diffusion FD, the drain of the transfer transistor MN2, and the gate of the transistor MN4 (to be described later) of the comparison circuit 22.

With this configuration, in the light-receiving circuit 21, the electric charges accumulated in the photodiode PD are discharged by turning on the discharge transistor MN1 on the basis of the control signal OFG. The discharge transistor MN1 is then turned off to start a light exposure period, and electric charges in the amount corresponding to the amount of received light are accumulated in the photodiode PD. Then, after the light exposure period ends, the light-receiving circuit 21 supplies the pixel signal SIG including a reset voltage Vreset and the pixel voltage Vpix to the comparison circuit 22. Specifically, as described below, in a P-phase (Pre-charge phase) period TP after the voltage of the floating diffusion FD is reset, the light-receiving circuit 21 supplies the voltage of the floating diffusion FD at that time as the reset voltage Vreset to the comparison circuit 22. In addition, in a D-phase (Data phase) period TD after electric charges are transferred from the photodiode PD to the floating diffusion FD, the light-receiving circuit 21 supplies the voltage of the floating diffusion FD at that time as the pixel voltage Vpix to the comparison circuit 22.

The comparison circuit 22 is configured to generate a signal CMP by comparing the reference signal REF with the pixel signal SIG. The comparison circuit 22 changes the signal CMP to a high level in a case where the voltage of the reference signal REF is higher than the voltage of the pixel signal SIG, and changes the signal CMP to a low level in a case where the voltage of the reference signal REF is lower than the voltage of the pixel signal SIG. The comparison circuit 22 includes transistors MN4 to MN6, and transistors MP1 and MP2. The transistors MN4 to MN6 are N-type MOS transistors, and the transistors MP1 and MP2 are P-type MOS transistors. The comparison circuit 22 is disposed over the two semiconductor substrates 101 and 102. Specifically, the transistors MN4 to MN6 are disposed on the semiconductor substrate 101, and the transistors MP1 and MP2 are disposed on the semiconductor substrate 102.

The transistor MN4 has the gate supplied with the pixel signal SIG, the drain coupled to the drain of the reset transistor MN3 in the light-receiving circuit 21 and coupled to a drain of the transistor MP1 and an input terminal of the amplifier AMP via the wiring line 103 between the semiconductor substrates 101 and 102, and a source coupled to a source of the transistor MN5 and a drain of the transistor MN6. The transistor MN5 has a gate supplied with the reference signal REF from the reference signal generator 12 via the wiring line 103 between the semiconductor substrates 101 and 102, a drain coupled to a drain of the transistor MP2 and gates of the transistors MP1 and MP2 via the wiring line 103 between the semiconductor substrates 101 and 102, and the source coupled to the source of the transistor MN4 and the drain of the transistor MN6. As described in detail below, the reference signal REF is a signal having a so-called ramp waveform in which a voltage level gradually changes with a lapse of time in the P-phase period TP and the D-phase period TD. The transistor MN6 has a gate supplied with a bias voltage Vb, the drain coupled to the sources of the transistors MN4 and MN5, and a source grounded. The transistors MN4 and MN5 configure a differential pair, and the transistor MN6 configures a constant current source.

The transistor MP1 has the gate coupled to the gate and the drain of the transistor MP2 and coupled to the drain of the transistor MN5 via the wiring line 103 between the semiconductor substrates 101 and 102, a source supplied with a power supply voltage VDD, and the drain coupled to the input terminal of the amplifier AMP, and coupled to the drain of the transistor MN4, and the drain of the reset transistor MN3 in the light-receiving circuit 21 via the wiring line 103 between the semiconductor substrates 101 and 102. The transistor MP2 has the gate coupled to the gate of the transistor MP1 and the drain of the transistor MP2, and coupled to the drain of the transistor MN5 via the wiring line 103 between the semiconductor substrates 101 and 102, a source supplied with the power supply voltage VDD, and the drain coupled to the gates of the transistors MP1 and MP2, and coupled to the drain of the transistor MN5 via the wiring line 103 between the semiconductor substrates 101 and 102. The transistors MP1 and MP2 configure active loads of the transistors MN4 and MN5.

The amplifier AMP has the input terminal coupled to the drain of the transistor MP1, and coupled to the drain of the reset transistor MN3, and the drain of the reset transistor MN3 in the light-receiving circuit 21 via the wiring line 103 between the semiconductor substrates 101 and 102, and an output terminal coupled to the latch 23. The comparison circuit 22 outputs the signal CMP from the output terminal of the amplifier AMP.

The latch 23 is configured to latch a time code CODE supplied from the pixel driving unit 13 (FIG. 1) on the basis of the signal CMP supplied from the comparison circuit 22. The time code CODE changes with a lapse of time. It is possible to use, for example, a gray code for the time code CODE. As described below, the latch 23 latches the time code CODE at a transition timing of the signal CMP in the P-phase period TP to obtain time (code value CODE1) from the start of the P-phase period TP until transition of the signal CMP takes place. In addition, the latch 23 latches the time code CODE at the transition timing of the signal CMP in the D-phase period TD to obtain time (code value CODE2) from the start of the D-phase period TD until transition of the signal CMP takes place. A difference (CODE2−CODE1) between these two code values corresponds to a pixel value corresponding to the amount of received light. The latch 23 then supplies the two code values CODE1 and CODE2 to the signal processor 15 on the basis of a control signal supplied from the vertical driving unit 14.

Thus, the pixel circuit 20 generates the pixel signal SIG including the pixel voltage Vpix corresponding to the amount of received light, and performs AD conversion on the basis of the pixel signal SIG to generate the code values CODE1 and CODE2.

The reference signal generator 12 is configured to generate the reference signal REF. The reference signal REF is a signal having a so-called ramp waveform in which a voltage level gradually changes with a lapse of time in the P-phase period TP and the D-phase period TD. The reference signal generator 12 then supplies the generated reference signal REF to a plurality of pixel circuits 20 in the pixel array 11 (FIG. 1). The reference signal generator 12 is disposed on the semiconductor substrate 102, as illustrated in FIG. 3.

The pixel driving unit 13 (FIG. 1) is configured to control operations of the plurality of pixel circuits 20 in the pixel array 11. Specifically, the pixel driving unit 13 generates the control signals OFG, TX, and RST and supplies these control signals OFG, TX, and RST to the light-receiving circuit 21, and generates the time code CODE and supplies the time code CODE to the latch 23, thereby controlling the operations of the pixel circuits 20. The pixel driving unit 13 is disposed on the semiconductor substrate 102, for example.

The vertical driving unit 14 is configured to supply the code values CODE1 and CODE2 generated by each of the plurality of pixel circuits 20 in the pixel array 11 to the signal processor 15 in predetermined order. The vertical driving unit 14 is disposed on the semiconductor substrate 102, for example.

The signal processor 15 is configured to generate an image signal Spic by performing predetermined image processing on the basis of the code values CODE1 and CODE2 generated by each of the plurality of pixel circuits 20. Examples of the predetermined image processing include processing for generating a pixel value with use of the principle of correlated double sampling (DCS; Correlated Double Sampling) on the basis of the two code values CODE1 and CODE2 generated by the pixel circuit 20, and black level correction processing for correcting a black level. The signal processor 15 is disposed on the semiconductor substrate 102, for example.

The timing generator 16 is configured to control the operation of the imaging device 1 by generating various timing signals and supplying the various generated timing signals to the reference signal generator 12, the pixel driving unit 13, the vertical driving unit 14, and the signal processor 15. The timing generator 16 is disposed on the semiconductor substrate 102, for example.

(Reference Signal Generator 12)

FIG. 4 illustrates a configuration example of the reference signal generator 12. It is to be noted that FIG. 4 also illustrates a plurality of pixel circuits 20 to be supplied with the reference signal REF generated by the reference signal generator 12. The reference signal generator 12 includes a signal generation circuit 31 and a voltage follower circuit 34.

The signal generation circuit 31 is configured to generate a signal REF0 having a ramp waveform similar to that of the reference signal REF. The signal generation circuit 31 includes a current source 32 and a resistor 33. The current source 32 is a variable current source in which a current to be sent is variable, and has one end supplied with the power supply voltage VDD, and another end coupled to one end of the resistor 33 and an input terminal of the voltage follower circuit 34. The resistor 33 has the one end coupled to the other end of the current source 32 and the input terminal of the voltage follower circuit 34, and another end grounded. With this configuration, the signal REF having a ramp waveform is generated by switching a current value of the current sent by the current source 32.

The voltage follower circuit 34 is configured to generate the reference signal REF by performing a voltage follower operation on the basis of the signal REF0. The voltage follower circuit 34 includes an amplifier 35. The amplifier 35 has a positive input terminal InP, a negative input terminal InN, and an output terminal OUT. The amplifier 35 has the positive input terminal InP supplied with the signal REF0, and the negative input terminal InN coupled to the output terminal OUT of the amplifier 35. The amplifier 35 outputs the reference signal REF from the output terminal OUT. The voltage follower circuit 34 supplies the reference signal REF outputted from the output terminal OUT of the amplifier 35 to the negative input terminal InN of the amplifier 35. The voltage follower circuit 34 performs the voltage follower operation by performing a negative feedback operation in such a manner.

Thus, in the reference signal generator 12, the signal generation circuit 31 generates the signal REF having a ramp waveform, and the voltage follower circuit 34 generates the reference signal REF by performing the voltage follower operation on the basis of this signal REF0. The reference signal generator 12 then supplies the generated reference signal REF to the plurality of pixel circuits 20 in the pixel array 11 (FIG. 1).

FIG. 5 illustrates a configuration example of the amplifier 35. The amplifier 35 includes a differential input circuit 91, a bias circuit 92, and an output circuit 93. The differential input circuit 91 is configured to output a differential signal corresponding to a voltage difference between a voltage at the positive input terminal InP and a voltage at the negative input terminal InN. The bias circuit 92 is configured to set an operating point of the output circuit 93 on the basis of the differential signal supplied from the differential input circuit 91. This bias circuit 92 is a circuit using the translinear principle. The output circuit 93 is an output circuit that enables a rail-to-rail operation. Such an amplifier 35 is also called a cross-coupled feedfoward class-AB amplifier, for example.

Figure 6:
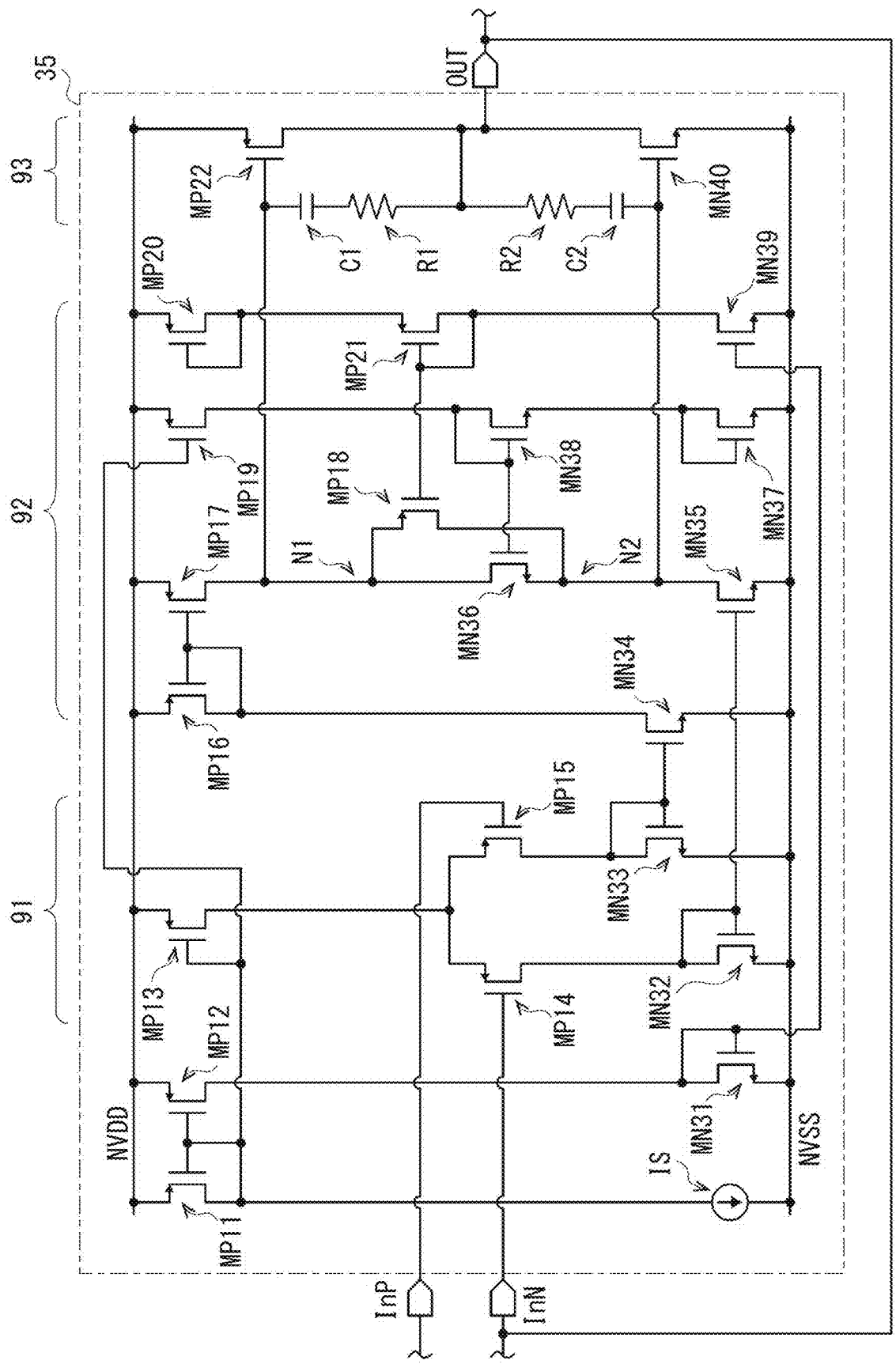
FIG. 6 is a circuit diagram illustrating a configuration example of the amplifier illustrated in FIG. 4.

FIG. 6 illustrates an example of a specific circuit configuration of the amplifier 35. The amplifier 35 includes a constant current source IS, transistors MP11 to MP22 and MN31 to MN40, resistors R1 and R2, and capacitors C1 and C2. The transistors MP11 to MP22 are P-type MOS transistors, and the transistors MN31 to MN40 are N-type MOS transistors.

The constant current source IS has one end coupled to a gate and a drain of the transistor MP11 and coupled to gates of the transistors MP12, MP13, and MP19, and another end coupled to aground node NVSS. The transistor MP11 has the gate coupled to the drain of the transistor MP11 and the one end of the constant current source IS and coupled to the gates of the transistors MP12, MP13, and MP19, a source coupled to a power supply node NVDD, and the drain coupled to the gate of the transistor MP11 and the one end of the constant current source IS and coupled to the gates of the transistors MP12, MP13, and MP19. The transistors MP11, MP12, MP13, and MP19 configure a current mirror circuit.

The transistor MP12 has the gate coupled to the gate and the drain of the transistor MP11 and coupled to the one end of the constant current source IS and the gates of the transistors MP13 and MP19, a source coupled to the power supply node NVDD, and a drain coupled to a gate and a drain of the transistor MN31 and coupled to a gate of the transistor MN39. The transistor MN31 has the gate coupled to the drains of the transistors MN31 and MP12 and coupled to the gate of the transistor MN39, the drain coupled to the gate of the transistor MN31 and the drain of the transistor MP12 and coupled to the gate of the transistor MN39, and a source coupled to the ground node NVSS. The transistors MN31 and MN39 configure a current mirror circuit.

The transistor MP13 has the gate coupled to the gate and the drain of the transistor MP11 and coupled to the one end of the constant current source IS and the gates of the transistors MP12 and MP19, a source coupled to the power supply node NVDD, and a drain coupled to sources of the transistors MP14 and MP15. The transistor MP14 has a gate coupled to the negative input terminal InN of the amplifier 35, the source coupled to the source of the transistor MP15 and coupled to the drain of the transistor MP13, and a drain coupled to a gate and a drain of the transistor MN32 and coupled to a gate of the transistor MN35. The transistor MP15 has the gate coupled to the positive input terminal InP of the amplifier 35, the source coupled to the source of the transistor MP14 and coupled to the drain of the transistor MP13, and a drain coupled to a gate and a drain of the transistor MN33 and coupled to a gate of the transistor MN34. The transistor MN32 has the gate coupled to the drains of the transistors MN32 and MP14 and coupled to the gate of the transistor MN35, the drain coupled to the gate of the transistor MN32 and the drain of the transistor MP14 and coupled to the gate of the transistor MN35, and a source coupled to the ground node NVSS. The transistor MN33 has the gate coupled to the drains of the transistors MN33 and MP15 and coupled to the gate of the transistor MN34, the drain coupled to the gate of the transistor MN33 and the drain of the transistor MP15 and coupled to the gate of the transistor MN34, and a source coupled to the ground node NVSS. The transistors MP14 and MP15 configure a differential pair. The transistors MN32 and MN35 configure a current mirror circuit, and the transistors MN33 and MN34 configure a current mirror circuit.

The transistors MP13 to MP15, MN32, and MN33 correspond to the differential input circuit 91 illustrated in FIG. 5.

The transistor MN34 has the gate coupled to the gate and the drain of the transistor MN33 and coupled to the drain of the transistor MP15, a drain coupled to a gate and a drain of the transistor MP16 and coupled to a gate of the transistor MP17, and a source coupled to the ground node NVSS. The transistor MP16 has the gate coupled to the drains of the transistors MP16 and MN34 and coupled to the gate of the transistor MP17, a source coupled to the power supply node NVDD, and the drain coupled to the gate of the transistor MP16 and the drain of the transistor MN34 and coupled to the gate of the transistor MP17. The transistors MP16 and MP17 configure a current mirror circuit.

The transistor MP17 has the gate coupled to the gate and the drain of the transistor MP16 and coupled to the drain of the transistor MN34, a source coupled to the power supply node NVDD, and a drain coupled to anode N1. The transistor MP18 has a gate coupled to a gate and a drain of the transistor MP21 and coupled to a drain of the transistor MN39, a source coupled to the node N1, and a drain coupled to a node N2. The transistor MN36 has a gate coupled to a gate and a drain of the transistor MN38 and coupled to a drain of the transistor MP19, a drain coupled to the node N1, and a source coupled to the node N2. The transistor MN35 has the gate coupled to the gate and the drain of the transistor MN32 and coupled to the drain of the transistor MP14, a drain coupled to the node N2, and a source coupled to the ground node NVSS.

The transistor MP19 has the gate coupled to the gate and the drain of the transistor MP11 and coupled to the one end of the constant current source IS and the gates of the transistors MP12 and MP13, a source coupled to the power supply node NVDD, and the drain coupled to the gate and the drain of the transistor MN38 and coupled to the gate of the transistor MN36. The transistor MN38 has the gate coupled to the drain of the transistor MN38 and the drain of the transistor MP19 and coupled to the gate of the transistor MN36, the drain coupled to the gate of the transistor MN38 and the drain of the transistor MP19 and coupled to the gate of the transistor MN36, and the source coupled to a gate and a drain of the transistor MN37. The transistor MN37 has the gate coupled to the drain of the transistor MN37 and the source of the transistor MN38, the drain coupled to the gate of the transistor MN37 and the source of the transistor MN38, and a source coupled to the ground node NVSS. The transistors MP19, MN38, and MN37 configure a bias circuit that generates a bias voltage to be supplied to the gate of the transistor MN36.

The transistor MP20 has a gate coupled to a drain of the transistor MP20 and a source of the transistor MP21, a source coupled to the power supply node NVDD, and the drain coupled to the gate of the transistor MP20 and the source of the transistor MP21. The transistor MP21 has the gate coupled to the drains of the transistors MP21 and MN39 and coupled to the gate of the transistor MP18, the source coupled to the gate and the drain of the transistor MP20, and the drain coupled to the gate of the transistor MP21 and the drain of the transistor MN39 and coupled to the gate of the transistor MP18. The transistor MN39 has the gate coupled to the gate and the drain of the transistor MN31 and coupled to the drain of the transistor MP12, the drain coupled to the gate and the drain of the transistor MP21 and coupled to the gate of the transistor MP18, and a source coupled to the ground node NVSS. The transistors MP20, MP21, and MN39 configure a bias circuit that generates a bias voltage to be supplied to the gate of the transistor MP18.

The transistors MP16 to MP21 and MN34 to MN39 correspond to the bias circuit 92 illustrated in FIG. 5.

The transistor MP22 has a gate coupled to the node N1, a source coupled to the power supply node NVDD, and a drain coupled to the output terminal OUT of the amplifier 35. The transistor MN40 has a gate coupled to the node N2, a drain coupled to the output terminal OUT of the amplifier 35, and a source coupled to the ground node NVSS. The capacitor C1 has one end coupled to the node N1 and another end coupled to one end of the resistor R1. The resistor R1 has the one end coupled to the other end of the capacitor C1, and another end coupled to the output terminal OUT. The capacitor C2 has one end coupled to the node N2 and another end coupled to one end of the resistor R2. The resistor R2 has the one end coupled to the other end of the capacitor C2, and another end coupled to the output terminal OUT. The capacitors C1 and C2, and the resistors R1 and R2 configure a phase compensation circuit.

The transistors MP22 and MN40, the capacitor C1 and C2, and the resistors R1 and R2 correspond to the output circuit 93 illustrated in FIG. 5.

With this configuration, in the imaging device 1, as described below, it is possible to stably supply the reference signal REF to the pixel circuits 20 of the plurality of pixels P in the pixel array 11.

Here, the pixel circuit 20 corresponds to a specific example of a "pixel circuit" in the present disclosure. The reference signal generator 12 corresponds to a specific example of a "reference signal generator" in the present disclosure. The signal generation circuit 31 corresponds to a specific example of a "signal generation circuit" in the present disclosure. The voltage follower circuit 34 corresponds to a specific example of a "voltage follower circuit" in the present disclosure. The pixel signal SIG corresponds to a specific example of a "pixel signal" in the present disclosure. The reference signal REF corresponds to a specific example of a "reference signal" in the present disclosure. The amplifier 35 corresponds to a specific example of an "amplifier" in the present disclosure. The output circuit 93 corresponds to a specific example of an "output circuit" in the present disclosure.

The power supply node NVDD corresponds to a specific example of a "first power supply node" in the present disclosure. The ground node NVSS corresponds to a specific example of a "second power supply node" in the present disclosure. The transistor MP22 corresponds to a specific example of a "first transistor" in the present disclosure. The transistor MN40 corresponds to a specific example of a "second transistor" in the present disclosure. The pair of the transistors MP14 and MP15 corresponds to a specific example of a "first differential transistor pair" in the present disclosure. The transistor MP17 corresponds to a specific example of a "third transistor" in the present disclosure. The transistor MN35 corresponds to a specific example of a "fourth transistor" in the present disclosure. The transistor MP18 corresponds to a specific example of a "fifth transistor" in the present disclosure. The transistor MN36 corresponds to a specific example of a "sixth transistor" in the present disclosure. The node N1 corresponds to a specific example of a "first node" in the present disclosure. The node N2 corresponds to a specific example of a "second node" in the present disclosure. The transistor MN33 corresponds to a specific example of a "seventh transistor" in the present disclosure. The transistor MN32 corresponds to a specific example of an "eighth transistor" in the present disclosure.

The transistor MN34 corresponds to a specific example of a "ninth transistor" in the present disclosure. The transistor MP16 corresponds to a specific example of a "tenth transistor" in the present disclosure.

[Operation and Workings]

Next, description is given of the operation and workings of the imaging device 1 according to the present embodiment.

(Overview of Overall Operation)

First, an overview of an overall operation of the imaging device 1 is described with reference to FIGS. 1 and 3. The reference signal generator 12 generates the reference signal REF. Each of the plurality of pixel circuits 20 in the pixel array 11 generates the pixel signal SIG including the pixel voltage Vpix corresponding to the amount of received light, and performs AD conversion on the basis of the pixel signal SIG to generate the code values CODE1 and CODE2. The pixel driving unit 13 controls the operations of the plurality of pixel circuits 20 in the pixel array 11. The vertical driving unit 14 supplies the code values CODE1 and CODE2 generated by each of the plurality of pixel circuits 20 in the pixel array 11 to the signal processor 15 in predetermined order. The signal processor 15 performs predetermined image processing on the basis of the code values CODE1 and CODE2 generated by each of the plurality of pixel circuits 20 to generate the image signal Spic. The timing generator 16 generates various timing signals, and supplies the various generated timing signals to the reference signal generator 12, the pixel driving unit 13, the vertical driving unit 14, and the signal processor 15 to control the operation of the imaging device 1.

(Detailed Operation)

In each of the plurality of pixel circuits 20 (FIG. 3) in the pixel array 11, the discharge transistor MN1 is turned on, on the basis of the control signal OFG to discharge electric charges accumulated in the photodiode PD. The discharge transistor MN1 is then turned off to start the light exposure period and accumulate electric charges in an amount corresponding to an amount of received light in the photodiode PD. Then, after the light exposure period ends, the pixel circuit 20 performs AD conversion on the basis of the pixel signal SIG including the reset voltage Vreset and the pixel voltage Vpix. This AD conversion is described in detail below.

Figure 7:
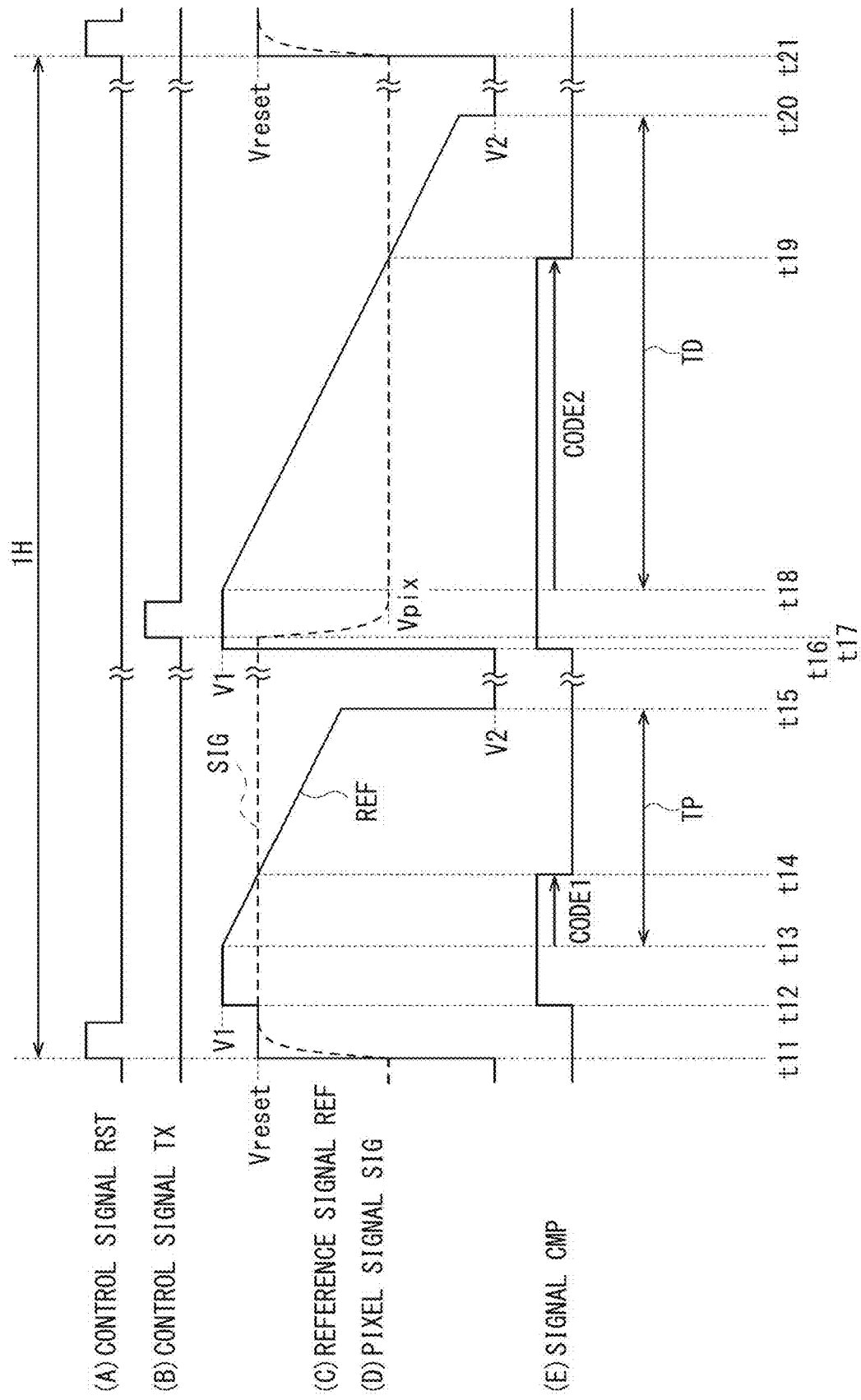
FIG. 7 is a timing waveform diagram illustrating an operation example of the imaging device illustrated in FIG. 1.

FIG. 7 illustrates an operation example of AD conversion in the pixel circuit 20 of interest. (A) indicates a waveform of the control signal RST, (B) indicates a waveform of the control signal TX, (C) indicates a waveform of the reference signal REF, (D) indicates a waveform of the pixel signal SIG, and (E) indicates a waveform of the signal CMP.

First, at a timing t11, the reference signal generator 12 changes the voltage of the reference signal REF to the reset voltage Vreset ((C) of FIG. 7). In addition, at the timing t11, the pixel driving unit 13 changes the control signal RST from a low level to a high level ((A) of FIG. 7). Thus, in the pixel circuit 20, the reset transistor MN3 is turned on, the floating diffusion FD is reset, and the voltage of the pixel signal SIG is changed to the reset voltage Vreset ((D) of FIG. 7). Then, after a lapse of a predetermined time from the timing t11, the pixel driving unit 13 changes the control signal RST from the high level to the low level ((A) of FIG. 7). This turns off the reset transistor MN3.

Next, at a timing t12, the reference signal generator 12 changes the voltage of the reference signal REF from the reset voltage Vreset to a voltage V1 ((C) of FIG. 7). This causes the voltage of the reference signal REF to be higher than the voltage of the pixel signal SIG; therefore, the comparison circuit 22 changes the signal CMP to the high level ((E) of FIG. 7).

Next, in a period (P-phase period TP) from a timing t13 to a timing t15, the pixel circuit 20 performs AD conversion on the basis of the voltage (reset voltage Vreset) of the pixel signal SIG. Specifically, at the timing t13, the reference signal generator 12 starts to decrease the voltage of the reference signal REF from the voltage V1 by a predetermined degree of change ((C) of FIG. 7). In addition, at the timing t13, the pixel driving unit 13 starts an increment operation on the time code CODE.

At the timing t14, the voltage of the reference signal REF then falls below the voltage (reset voltage Vreset) of the pixel signal SIG ((C) and (D) of FIG. 7). Accordingly, the comparison circuit 22 changes the signal CMP from the high level to the low level ((E) of FIG. 7). The latch 23 latches the time code CODE on the basis of transition of this signal CMP. The code value of the time code CODE latched by the latch 23 at the timing t14 is CODE1. The code value CODE1 is a code value corresponding to the length of time from the timing t13 to the timing t14, as well as a code value corresponding to the reset voltage Vreset.

At the timing t15, the reference signal generator 12 then changes the voltage of the reference signal REF to a voltage V2 at the end of the P-phase period TP ((C) of FIG. 7). Then, in a period from the timing t15 to a timing t16, the vertical driving unit 14 supplies the code value CODE1 generated by the pixel circuit 20 to the signal processor 15.

Next, at the timing t16, the reference signal generator 12 changes the voltage of the reference signal REF from the voltage V2 to the voltage V1 ((C) of FIG. 7). This causes the voltage of the reference signal REF to be higher than the voltage of the pixel signal SIG; therefore, the comparison circuit 22 changes the signal CMP from the low level to the high level ((E) of FIG. 7).

Next, at a timing t17, the pixel driving unit 13 changes the control signal TX from the low level to the high level ((B) of FIG. 7). Accordingly, in the pixel circuit 20, the transfer transistor MN2 is turned on, electric charges generated in the photodiode PD are transferred to the floating diffusion FD, and the voltage of the pixel signal SIG is changed to the pixel voltage Vpix ((D) of FIG. 7). Then, after a lapse of a predetermined time from the timing t17, the pixel driving unit 13 changes the control signal TX from the high level to the low level ((B) of FIG. 7). This turns off the transfer transistor MN2.

Next, in a period (D-phase period) from a timing t18 to a timing t20, the pixel circuit 20 performs AD conversion on the basis of the voltage (pixel voltage Vpix) of the pixel signal SIG. Specifically, at the timing t18, the reference signal generator 12 starts to decrease the voltage of the reference signal REF from the voltage V1 by a predetermined degree of change ((C) of FIG. 7). In addition, at this timing t18, the pixel driving unit 13 starts the increment operation on the time code CODE.

Then, at the timing t19, the voltage of the reference signal REF falls below the voltage (pixel voltage Vpix) of the pixel signal SIG ((C) and (D) of FIG. 7). Accordingly, the comparison circuit 22 changes the signal CMP from the high level to the low level ((E) of FIG. 7). The latch 23 latches the time code CODE on the basis of transition of this signal CMP. The code value of the time code CODE latched by the latch 23 at this timing t19 is CODE2. The code value CODE2 is a code value corresponding to the length of time from the timing t18 to the timing t19, as well as a code value corresponding to the pixel voltage Vpix.

At the timing t20, the reference signal generator 12 then changes the voltage of the reference signal REF to the voltage V2 at the end of the D-phase period TD ((C) of FIG. 7). Then, in a period from the timing t20 to a timing t21, the vertical driving unit 14 supplies the code value CODE2 generated by the pixel circuit 20 to the signal processor 15.

The signal processor 15 performs predetermined image processing on the basis of the code values CODE1 and CODE2 generated by each of the plurality of pixel circuits 20. For example, the signal processor 15 generates a pixel value with use of the principle of correlated double sampling on the basis of the two code values CODE1 and CODE2. In addition, the signal processor 15 performs black level correction processing for correcting a black level, and the like. Thus, the signal processor 15 generates the image signal Spic.

(About Voltage Follower Circuit 34)

Next, description is given of an operation of the voltage follower circuit 34. The voltage follower circuit 34 performs the negative feedback operation to generate the references signal REF corresponding to the signal REF0 supplied from the signal generation circuit 31, and supplies the generated reference signal REF to the plurality of pixel circuits 20 in the pixel array 11.

First, description is given of an operation of the bias circuit 92 in the amplifier 35.

Figure 8:
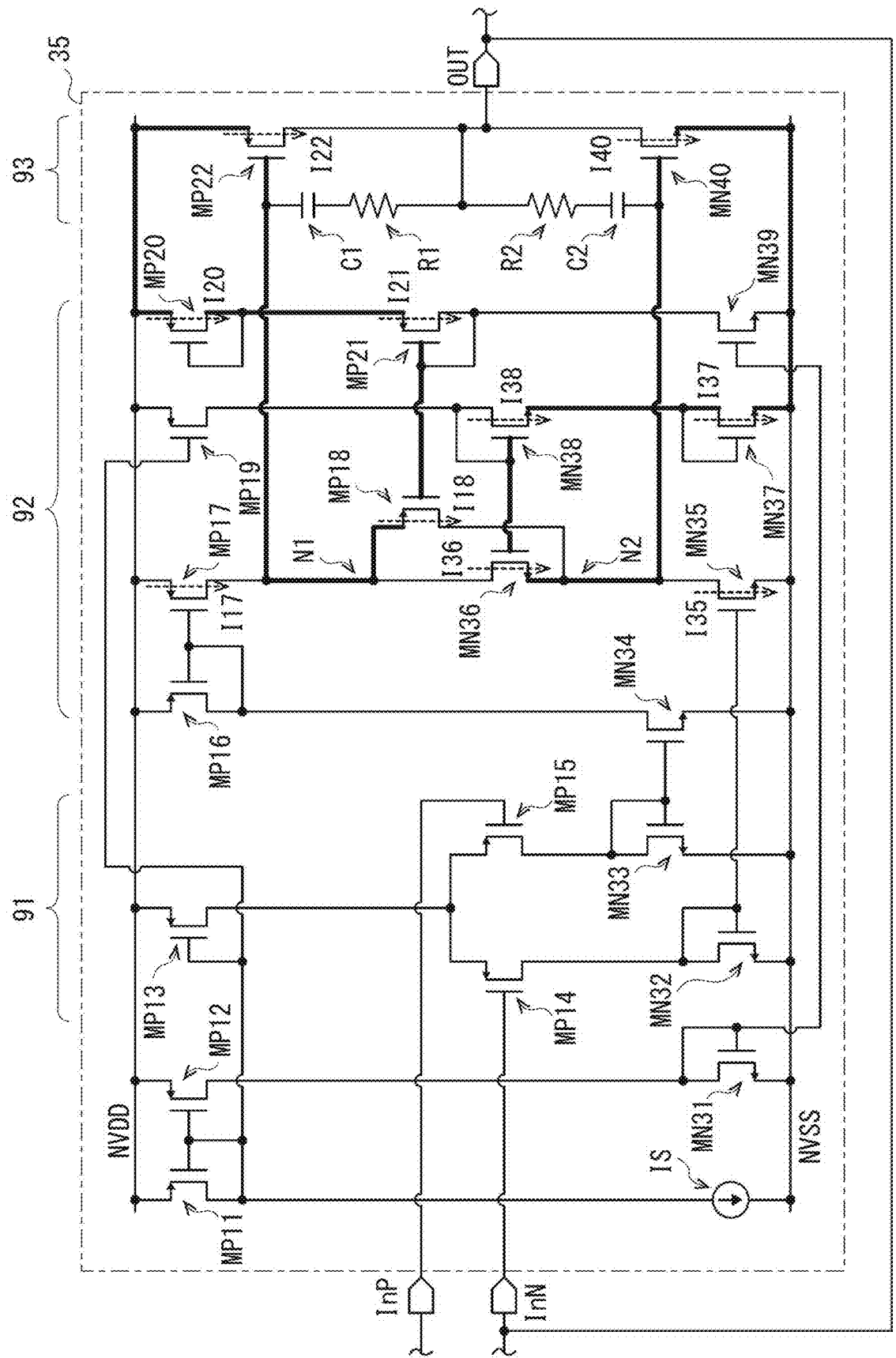
FIG. 8 is an explanatory diagram illustrating an operation example of the amplifier illustrated in FIG. 6.
Figure 11:
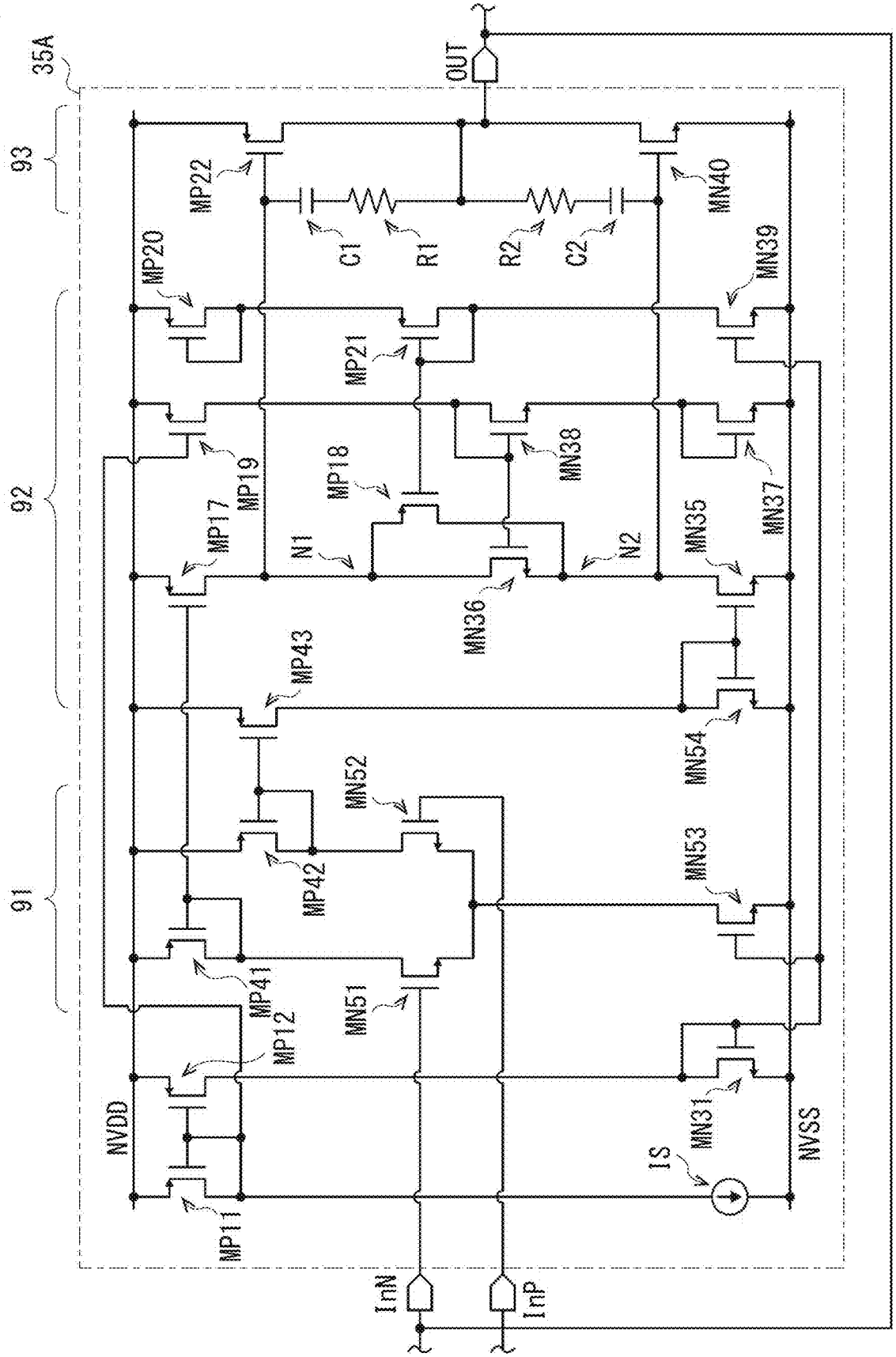
FIG. 11 is a circuit diagram illustrating a configuration example of an amplifier according to a modification example.

FIG. 8 illustrates an operation example of the amplifier 35. In the amplifier 35, for example, the transistors MN36, MN38, MN37, and MN40 configure one loop. In this loop, the following expression is established by the translinear principle.

$$Vgs(MN36)+Vgs(MN40)=Vgs(MN38)+Vgs(MN37) \quad (EQ1)$$

Here, Vgs(MN36) is a gate-source voltage of the transistor MN36, Vgs(MN40) is a gate-source voltage of the transistor MN40, Vgs(MN38) is a gate-source voltage of the transistor MN38, and Vgs(MN37) is a gate-source voltage of the transistor MN37. If the sizes (gate widths W and gate lengths L) of these four transistors MN36, MN38, MN37, and MN40 are equal to each other, the following expressions EQ2 and EQ3 are obtained from the expression EQ1.

$$I36=I38 \quad (EQ2)$$

$$I37=I40 \quad (EQ3)$$

Here, I36 is a current flowing through the transistor MN36, I38 is a current flowing through the transistor MN38, I37 is a current flowing through the transistor MN37, and I40 is a current flowing through the transistor MN40. Here, the currents I37 and I38 are set by a current value of the constant current source IS and a current mirror ratio in the transistors MP11 and MP19. These currents I37 and I38 are equal to each other. The currents I37 and I38 in the expressions EQ2 and EQ3 are set in such a manner, which consequently also sets the currents I36 and I40 in the expressions EQ2 and EQ3.

Likewise, in the amplifier 35, for example, the transistors MP18, MP21, MP20, and MP22 configure one loop. In this loop, the following expression is established by the translinear principle.

$$Vgs(MP18)+Vgs(MP22)=Vgs(MP21)+Vgs(MP20) \quad (EQ4)$$

Here, Vgs(MP18) is a gate-source voltage of the transistor MP18, Vgs(MP22) is a gate-source voltage of the transistor MP22, Vgs(MP21) is a gate-source voltage of the transistor MP21, and Vgs(MP20) is a gate-source voltage of the transistor MP20. If the sizes (gate widths W and gate lengths L) of these four transistors MP18, MP21, MP20, and MP22 are equal to each other, the following expressions EQ5 and EQ6 are obtained from the expression EQ4.

$$I18=I21 \qquad (EQ5)$$

$$I20=I22 \qquad (EQ6)$$

Here, I18 is a current flowing through the transistor MP18, I21 is a current flowing through the transistor MP21, I20 is a current flowing through the transistor MP20, and I22 is a current flowing through the transistor MP22. Here, the currents I20 and I21 are set by a current value of the constant current source IS, a current mirror ratio in the transistors MP11 and MP12, and a current mirror ratio in the transistors MN31 and MN39. These currents I20 and I21 are equal to each other. The currents I20 and I21 in the expressions EQ5 and EQ6 are set in such a manner, which consequently also sets the currents I18 and I20 in the expressions EQ5 and EQ6.

As described above, a case where the sizes of the four transistors MN36, MN38, MN37, and MN40 are equal to each other and the sizes of the four transistors MP18, MP21, MP20, and MP22 are equal to each other has been described as an example. In actuality, adjusting the sizes of MN36 and MN40 makes it possible to set the currents I36 and I40, and adjusting the sizes of the MP18 and MP22 makes it possible to set the currents I18 and I20 similarly.

The following focuses on current paths of the transistors MP17, MP18, MN36, and MN35. In a steady state in which a voltage at the positive input terminal InP and a voltage at the negative input terminal InN are equal to each other, the amplifier 35 is set to establish the following expression, for example.

$$I17=I35=I18+I36 \qquad (EQ7)$$

Here, I17 is a current flowing through the transistor MP17, and I35 is a current flowing through the transistor MN35. In the steady state, as indicated in the expression EQ7, the current I17 flowing through the transistor MP17 and the current I35 flowing through the transistor MN35 are equal to each other.

For example, in a case where the voltage at the positive input terminal InP of the amplifier 35 is increased, an increase in the current flowing through the transistor MP14 and a decrease in the current flowing through the transistor MP15 transiently take place, resulting in an increase in the current I25 flowing through the transistor MN35 and a decrease in the current I17 flowing through the transistor MP17. In this case, voltages at the nodes N1 and N2 are decreased. The absolute value of the gate-source voltage Vgs(MP18) of the transistor MP18 is decreased by a decrease in the voltage at the node N1, which decreases the current I18 flowing through the transistor MP18. The absolute value of the gate-source voltage Vgs(MP18) of the transistor MP18 is decreased in such a manner, thereby increasing the absolute value of the gate-source voltage Vgs(MP22) of the transistor MP22 as can be seen from the expression EQ4. This increases the current I22 flowing through the transistor MP22. In addition, the gate-source voltage Vgs(MN36) of the transistor MN36 is increased by a decrease in the voltage at the node N2, which increases the current I36 flowing through the transistor MN36. The absolute value of the gate-source voltage Vgs(MN36) of the transistor MN36 is increased in such a manner, thereby decreasing the gate-source voltage Vgs(MN40) of the transistor MN40 as can be seen from the expression EQ1. This decreases the current I40 flowing through the transistor MN40. Thus, in the output circuit 93, the current I22 flowing through the transistor MP22 is increased and the current I40 flowing through the transistor MN40 is decreased; therefore, the voltage at the output terminal OUT of the amplifier 35 is increased. In the voltage follower circuit 34, the output terminal OUT of the amplifier 35 is coupled to the negative input terminal InN; therefore, the voltage at the negative input terminal InN of the amplifier 35 is increased. Then, in a case where the voltage at the positive input terminal InP and the voltage at the negative input terminal InN become substantially equal to each other, the state returns to the steady state (expression EQ7).

Likewise, for example, in a case where the voltage at the positive input terminal InP of the amplifier 35 is decreased, an increase in the current flowing through the transistor MP15 and a decrease in the current flowing through the transistor MP14 transiently take place, resulting in an increase in the current I17 flowing through the transistor MN17 and a decrease in the current I35 flowing through the transistor MP35. In this case, voltages at the nodes N1 and N2 are increased. The absolute value of the gate-source voltage Vgs(MP18) of the transistor MP18 is increased by an increase in the voltage at the node N1, which increases the current I18 flowing through the transistor MP18. The absolute value of the gate-source voltage Vgs(MP18) of the transistor MP18 is increased in such a manner, thereby decreasing the absolute value of the gate-source voltage Vgs(MP22) of the transistor MP22 as can be seen from the expression EQ4. This decreases the current I22 flowing through the transistor MP22. In addition, the gate-source voltage Vgs(MN36) of the transistor MN36 is decreased by an increase in the voltage at the node N2, which decreases the current I36 flowing through the transistor MN36. The absolute value of the gate-source voltage Vgs(MN36) of the transistor MN36 is decreased in such a manner, thereby increasing the gate-source voltage Vgs(MN40) of the transistor MN40 as can be seen from the expression EQ1. This increases the current I40 flowing through the transistor MN40. Thus, in the output circuit 93, the current I40 flowing through the transistor MP40 is increased and the current I22 flowing through the transistor MN22 is decreased; therefore, the voltage at the output terminal OUT of the amplifier 35 is decreased. In the voltage follower circuit 34, the output terminal OUT of the amplifier 35 is coupled to the negative input terminal InN; therefore, the voltage at the negative input terminal InN of the amplifier 35 is decreased. Then, in a case where the voltage at the positive input terminal InP and the voltage at the negative input terminal InN become substantially equal to each other, the state returns to the steady state (expression EQ7).

In the voltage follower circuit 34, in a case where the signal REF0 inputted to the positive input terminal InP of the amplifier 35 is changed, the currents I22 and I40 in the output circuit 93 may be greatly changed. However, inside the voltage follower circuit 34, change in voltages at various nodes is small. In addition, for example, even in a case where the voltage at the output terminal OUT is changed within a wide voltage range from a ground level to a power supply voltage level, change in the voltages at the various nodes is small. As a result, the voltage follower circuit 34 is able to stably operate as described below.

FIG. 9 illustrates a simulation result of oscillation analysis in the voltage follower circuit 34. A characteristic WG_0 indicates a gain characteristic in a case where a load current is 0 mA, a characteristic WP_0 indicates a phase characteristic in a case where the load current is 0 mA. A characteristic WG_500 is a gain characteristic in a case where the load current is 500 mA, and a characteristic WP_500 is a phase characteristic in a case where the load current is 500 mA.

In the voltage follower circuit 34, even in a case where the load current is greatly changed in such a manner, it is possible to suppress variations in characteristics, and to secure a sufficient phase margin. Accordingly, the voltage follower circuit 34 is able to stably operate under various load conditions.

As described above, in the imaging device 1, the voltage follower circuit 34 is able to stably operate, which makes it possible to enhance image quality of a captured image. That is, in the imaging device 1, each of the plurality of pixel circuits 20 in the pixel array 11 performs AD conversion; therefore, it is necessary for the reference signal generator 12 to supply the reference signal REF to the plurality of pixel circuits 20. In a case where the reference signal REF is supplied to the plurality of pixel circuits 20 in such a manner, it is desired that the reference signal generator 12 be able to carry a large output current to enable driving of input capacitance in the plurality of pixel circuits 20 and wiring capacitance to the plurality of pixel circuits 20.

For example, as illustrated in FIG. 10, in a case where the reference signal generator 12R is configured to supply the reference signal REF to the plurality of pixel circuits 20 with use of a source follower 34R, it is necessary to increase the gate width W of the transistor 18 of the source follower 34R. However, in this case, a gate-source parasitic capacitance of the transistor 18 is increased; therefore, the cutoff frequency of the source follower 34R is decreased, and the output impedance of the source follower 34R is increased by an influence of the cutoff frequency in a high-frequency region. Accordingly, in a case where the reference signal generator 12R intends to supply the reference signal REF to the plurality of pixel circuits 20, oscillation and ringing occur due to such frequency characteristics; therefore, it is difficult to supply the reference signal REF to the plurality of pixel circuits 20 in the pixel array 11. As a result, it is difficult to enhance image quality in an imaging device including such a reference signal generator 12R.

In addition, for example, in a case where a typical operational amplifier is used to configure a voltage follower circuit, and a reference signal generator is configured to supply the reference signal REF to the plurality of pixel circuits 20 with use of such a voltage follower circuit, for example, an operating point of the operational amplifier is greatly changed upon greatly changing a load current, which greatly decreases the phase margin, for example. Accordingly, it is difficult for such a reference signal generator to supply the reference signal REF to the plurality of pixel circuits 20 in the pixel array 11. As a result, in an imaging device including such a reference signal generator, it is difficult to increase image quality.

In contrast, in the imaging device 1, as illustrated in FIGS. 5 and 6, the operating point of the output circuit 93 is set by the bias circuit 92 using the translinear principle. Accordingly, as described above, in a case where the voltage at the output terminal OUT is changed within a wide voltage range from the ground level to the power supply voltage level or in a case where the load current is greatly changed, it is possible to reduce change in the voltages at various nodes in the amplifier 35. This makes it possible for the reference signal generator 12 to supply the reference signal REF to the plurality of pixel circuits 20 in the pixel array 11. As a result, in the imaging device 1, it is possible to enhance image quality.

Thus, the imaging device 1 includes the signal generation circuit 31 that generates the signal REF0 having a ramp waveform, and the voltage follower circuit 34 that performs a voltage follower operation on the basis of the signal REF0 to generate the reference signal REF and supply the reference signal REF to the plurality of pixel circuits 20, which makes it possible to enhance image quality of a captured image as compared with a case where a source follower is used.

In addition, in the imaging device 1, the output circuit 93 of the amplifier 35 includes the P-type transistor MP22 having the source coupled to the power supply node NVDD and the drain coupled to the output terminal OUT, and the N-type transistor MP40 having the source coupled to the ground node NVSS and the drain coupled to the output terminal OUT. This makes it possible for the output circuit 93 to perform a rail-to-rail operation, which makes it possible for the reference signal generator 12 to generate the reference signal REF having a large amplitude. Accordingly, for example, in the imaging device 1, it is possible to improve the dynamic range of a captured image, which makes it possible to enhance image quality of the captured image.

In addition, in the imaging device 1, the amplifier 35 includes the transistor MP17, the transistors MP18 and MN36, and the transistor MN35 in one current path that couples the power supply node NVDD and the ground node NVSS. The transistor MP17 has the source coupled to the power supply node NVDD, and the transistor MN35 has the source coupled to the ground node NVSS. The transistor MP18 is provided between the transistor MP17 and the transistor MN35 in this current path, and has the source coupled to the node N1 in the current path, the gate supplied with a bias voltage, and the drain coupled to the node N2 in this current path. The transistor MN36 is provided between the transistor MP17 and the transistor MN35 in this current path, and has the source coupled to the node N2, the gate supplied with a bias voltage, and the drain coupled to the node N1. The amplifier 35 then controls a current flowing between the node N1 and the node N2 on the basis of currents flowing through the transistors MP14 and MP15 of the differential input circuit 19. Specifically, a current corresponding to the current flowing through the transistor MP15 of the differential input circuit 19 flows through the transistor MP17, and a current corresponding to the current flowing through the transistor MP14 of the differential input circuit 19 flows through the transistor MN35. Accordingly, it is possible to reduce change in the voltages at the various nodes in the voltage follower circuit 34, and the reference signal generator 12 is able to supply the reference signal REF to the plurality of pixel circuits 20. As a result, in the imaging device 1, it is possible to enhance image quality. In addition, in the imaging device 1, it is possible to enhance a frame rate. Accordingly, in the imaging device 1, it is possible to further enhance the image quality.

[Effects]

As described above, in the present embodiment, a signal generation circuit that generates the signal REF0 having a ramp waveform, and a voltage follower circuit that performs the voltage follower operation on the basis of the signal REF0 to generate the reference signal and supply the reference signal to a plurality of pixel circuits are provided, which makes it possible to enhance image quality of a captured image.

Modification Example 1

In the embodiment described above, the transistors MP14 and MP15 that are P-type MOS transistors are used to configure a differential pair of the differential input circuit 91, but this is not limitative. Instead of this, N-type MOS transistors may be used to configure a differential pair of the differential input circuit 91. An amplifier 35A according to the present modification example is described in detail below.

Figure 12:
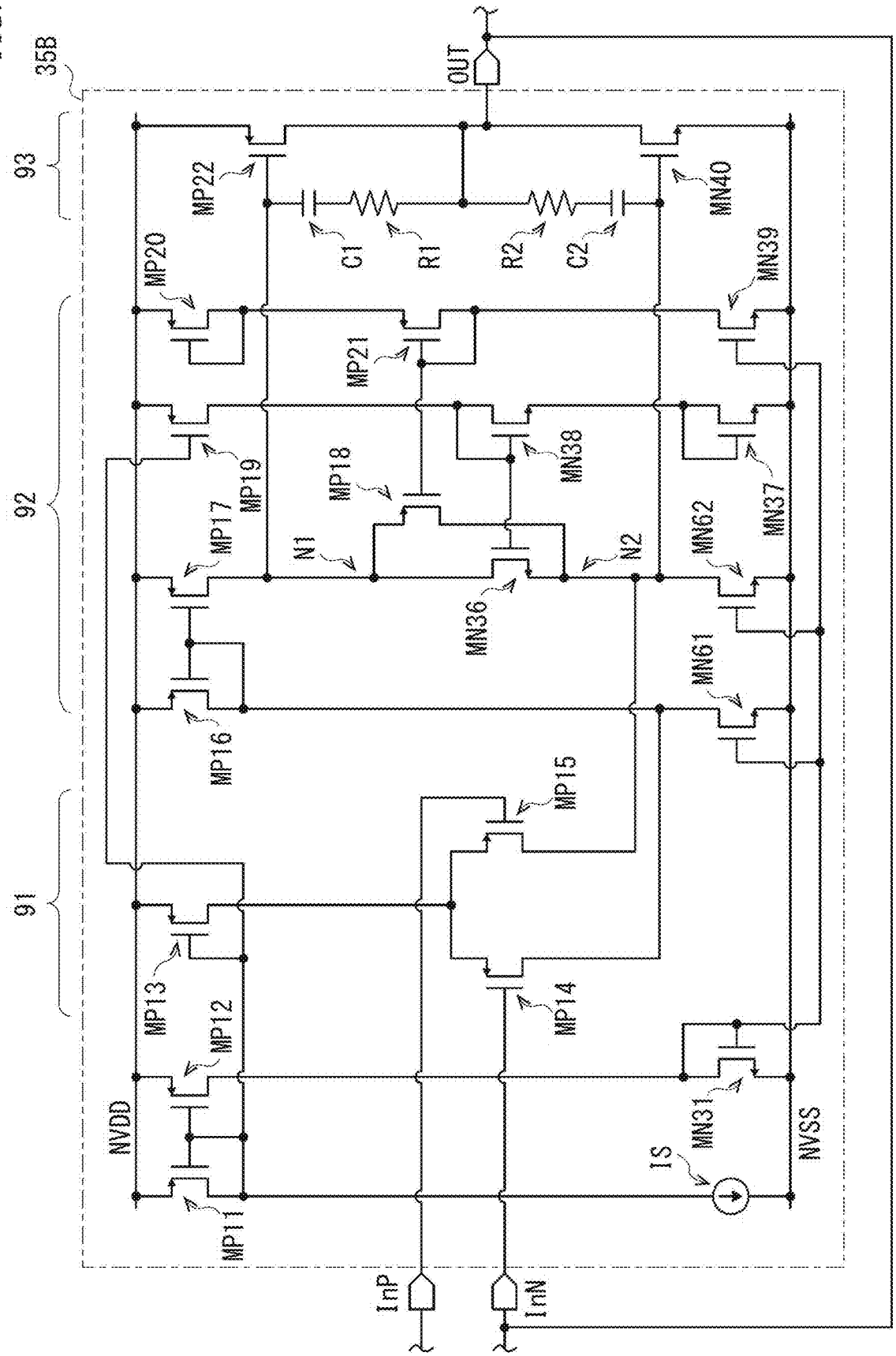
FIG. 12 is a circuit diagram illustrating a configuration example of an amplifier according to another modification example.

FIG. 12 illustrates a configuration example of the amplifier 35A. The amplifier 35A includes transistors MN51 to MN54 and MP41 to MP43. The transistors MN51 to MN54 are N-type MOS transistors, and the transistors MP41 to MP43 are P-type MOS transistors.

The transistor MN51 has a gate coupled to a negative input terminal InN of the amplifier 35A, a drain coupled to a gate and a drain of the transistor MP41 and coupled to the gate of the transistor MP17, and a source coupled to a source of the transistor MN52 and coupled to a drain of the transistor MN53. The transistor MN52 has a gate coupled to a positive input terminal InP of the amplifier 35A, a drain coupled to a gate and a drain of the transistor MP42 and coupled to a gate of the transistor MP43, and the source coupled to the source of the transistor MN51 and coupled to the drain of the transistor MN53. The transistor MN53 has agate coupled to the gate and the drain of the transistor MN31 and coupled to the drain of the transistor MP12 and the gate of the transistor MN39, the drain coupled to the sources of the transistors MN51 and MN52, and a source coupled to the ground node NVSS. The transistor MP41 has the gate coupled to the drains of the transistors MP41 and MN51 and the gate of the transistor MP17, a source coupled to the power supply node NVDD, and the drain coupled to the gate of the transistor MP41 and the drain of the transistor MN51 and coupled to the gate of the transistor MP17. The transistor MP42 has the gate coupled to the drains of the transistors MP42 and MN52 and coupled to the gate of the transistor MP43, a source coupled to the power supply node NVDD, and the drain coupled to the gate of the transistor MP42 and the drain of the transistor MN52 and coupled to the gate of the transistor MP43. The transistors MN51 and MN52 configure a differential pair. The transistors MP41 and MP17 configure a current mirror circuit, and the transistors MP42 and MP43 configure a current mirror circuit.

The transistors MN51 to MN53, MP41, and MP42 correspond to the differential input circuit 91 illustrated in FIG. 5.

The transistor MP43 has the gate coupled to the gate and the drain of the transistor MP42 and coupled to the drain of the transistor MN52, a source coupled to the power supply node NVDD, and a drain coupled to a gate and a drain of the transistor MN54 and the gate of the transistor MN35. The transistor MN54 has the gate coupled to the drains of the transistors MN54 and MP43 and coupled to the gate of the transistor MN35, the drain coupled to the gate of the transistor MN54 and the drain of the transistor MP43 and coupled to the gate of the transistor MN35, and a source coupled to the ground node NVSS. The transistors MN54 and MN35 configure a current mirror circuit.

The transistors MP43, MP17 to MP21, MN54, and MN35 to MN39 correspond to the bias circuit 92 illustrated in FIG. 5.

The ground node NVSS corresponds to a specific example of a "first power supply node" in the present disclosure. The power supply node NVDD corresponds to a specific example of a "second power supply node" in the present disclosure. The transistor MN40 corresponds to a specific example of a "first transistor" in the present disclosure. The transistor MP22 corresponds to a specific example of a "second transistor" in the present disclosure. The pair of the transistors MN51 and MN52 corresponds to a specific example of a "first differential transistor pair" in the present disclosure. The transistor MN35 corresponds to a specific example of a "third transistor" in the present disclosure. The transistor MP17 corresponds to a specific example of a "fourth transistor" in the present disclosure. The transistor MN36 corresponds to a specific example of a "fifth transistor" in the present disclosure. The transistor MP18 corresponds to a specific example of a "sixth transistor" in the present disclosure. The node N2 corresponds to a specific example of a "first node" in the present disclosure. The node N1 corresponds to a specific example of a "second node" in the present disclosure. The transistor MP42 corresponds to a specific example of a "seventh transistor" in the present disclosure. The transistor MP41 corresponds to a specific example of an "eighth transistor" in the present disclosure. The transistor MP43 corresponds to a specific example of a "ninth transistor" in the present disclosure. The transistor MN54 corresponds to a specific example of a "tenth transistor" in the present disclosure.

For example, in a case where the voltage at the positive input terminal InP of the amplifier 35A is increased, an increase in a current flowing through the transistor MN52 and a decrease in a current flowing through the transistor MN51 transiently take place, resulting in an increase in the current flowing through the transistor MN35 and a decrease in the current flowing through the transistor MP17. In this case, voltages at the nodes N1 and N2 are decreased. Accordingly, as with the embodiment described above, in the output circuit 93, the current flowing through the transistor MP22 is increased, and the current flowing through the transistor MN40 is decreased; therefore, the voltage at the output terminal OUT of the amplifier 35A is increased. Then, in a case where the voltage at the positive input terminal InP and the voltage at the negative input terminal InN become substantially equal to each other, the state returns to the steady state.

Likewise, for example, in a case where the voltage at the positive input terminal InP of the amplifier 35A is decreased, an increase in the current flowing through the transistor MP51 and a decrease in the current flowing through the transistor MP52 transiently take place, resulting in an increase in the current flowing through the transistor MN17 and a decrease in the current flowing through the transistor MP35. In this case, voltages at the nodes N1 and N2 are increased. Accordingly, as with the embodiment described above, in the output circuit 93, the current flowing through the transistor MN40 is increased, and the current flowing through the transistor MP22 is decreased; therefore, the voltage at the output terminal OUT of the amplifier 35A is decreased. Then, in a case where the voltage at the positive input terminal InP and the voltage at the negative input terminal InN become substantially equal to each other, the state returns to the steady state.

Modification Example 2

In the embodiment described above, the current mirror circuit (transistors MN32 to MN35) is used to couple the differential input circuit 91 and the bias circuit 92, but this it not limitative. An amplifier 35B according to the present modification example is described in detail below.

FIG. 12 illustrates a configuration example of the amplifier 35B. The amplifier 35B includes transistors MN61 and MN62. The transistors MN61 and MN62 are N-type MOS transistors.

The transistor MN61 has a gate coupled to the gate and the drain of the transistor MN31 and coupled to the drain of the transistor MP12 and gates of the transistors MN62 and MN39, a drain coupled to the drains of the transistors MP14 and MP16 and the gates of the transistors MP16 and MP17, and a source coupled to the ground node NVSS. The transistor MN62 has the gate coupled to the gate and the drain of the transistor MN31 and coupled to the drain of the transistor MP12 and the gates of the transistors MN61 and MN39, a drain coupled to the node N2, and a source coupled to the ground node NVSS. The transistors MN31, MN61, and MN62 configure a current mirror circuit.

The transistors MP13 to MP15 correspond to the differential input circuit 91 illustrated in FIG. 5. The transistors MP16 to MP21, MN61, MN62, and MN36 to MN39 correspond to the bias circuit 92 illustrated in FIG. 5. Thus, in the amplifier 35B, a folded cascade circuit is used to couple the differential input circuit 91 and the bias circuit 92.

The power supply node NVDD corresponds to a specific example of a "first power supply node" in the present disclosure. The ground node NVSS corresponds to a specific example of a "second power supply node" in the present disclosure. The transistor MP22 corresponds to a specific example of a "first transistor" in the present disclosure. The transistor MN40 corresponds to a specific example of a "second transistor" in the present disclosure. The pair of the transistors MP14 and MP15 corresponds to a specific example of a "first differential transistor pair" in the present disclosure. The transistor MP17 corresponds to a specific example of a "third transistor" in the present disclosure. The transistor MN35 corresponds to a specific example of a "fourth transistor" in the present disclosure. The transistor MP18 corresponds to a specific example of a "fifth transistor" in the present disclosure. The transistor MN36 corresponds to a specific example of a "sixth transistor" in the present disclosure. The node N1 corresponds to a specific example of a "first node" in the present disclosure. The node N2 corresponds to a specific example of a "second node" in the present disclosure. The transistor MN61 corresponds to a specific example of an "eleventh transistor" in the present disclosure. The transistor MP16 corresponds to a specific example of a "seventh transistor" in the present disclosure. The transistor MP14 corresponds to a specific example of a "first input transistor" in the present disclosure. The transistor MP15 corresponds to a specific example of a "second input transistor" in the present disclosure.

A total current of the current flowing through the transistor MP14 of the differential input circuit 91 and the current flowing through the transistor MP16 flows as a current having a predetermined current value through the transistor MN61. That is, the transistor MN61 operates as a constant current source; therefore, the current value of the total current is constant. Likewise, a total current of the current flowing through the transistor MP15 of the differential input circuit 91 and the currents flowing through the transistors MP18 and MN36 flows as a current having a predetermined current value through the transistor MN62. That is, the transistor MN62 operates as a constant current source, therefore, the current value of the total current is constant.

For example, in a case where the voltage at the positive input terminal InP of the amplifier 35B is increased, an increase in the current flowing through the transistor MP14 and a decrease in the current flowing through the transistor MP15 transiently take place. The current flowing through the transistor MP15 is decreased in such a manner thereby increasing the currents flowing from the transistors MP18 and MN36 to the transistor MN62. In addition, the current flowing through the transistor MP14 is increased in such a manner, thereby decreasing the current flowing from the transistor MP16 to the transistor MN61. This decreases the current flowing through the transistor MP17. In this case, the voltages at the nodes N1 and N2 are decreased. Accordingly, as with the embodiment described above, in the output circuit 93, the current flowing through the transistor MP22 is increased, and the current flowing through the transistor MN40 is decreased; therefore, the voltage at the output terminal OUT of the amplifier 35B is increased. Then, in a case where the voltage at the positive input terminal InP and the voltage at the negative input terminal InN become substantially equal to each other, the state returns to the steady state.

Likewise, for example, in a case where the voltage at the positive input terminal InP of the amplifier 35B is decreased, an increase in the current flowing through the transistor MP15 and a decrease in the current flowing through the transistor MP14 transiently take place. The current flowing through the transistor MP14 is decreased in such a manner, thereby increasing the current flowing from the transistor MP16 to the transistor MN61. This increases the current flowing through the transistor MP17. In addition, the current flowing through the transistor MP15 is increased in such a manner, thereby decreasing the current flowing from the transistors MP18 and MN36 to the transistor MN62. In this case, the voltages at the nodes N1 and N2 are increased. Accordingly, as with the embodiment described above, in the output circuit 93, the current flowing through the transistor MN40 is increased, and the current flowing through the transistor MP22 is decreased; therefore, the voltage at the output terminal OUT of the amplifier 35B is decreased. Then, in a case where the voltage at the positive input terminal InP and the voltage at the negative input terminal InN become substantially equal to each other, the state returns to the steady state.

Modification Example 3

In the embodiment described above, one differential pair is used to configure the differential input circuit 91, but this is not limitative. Instead of this, two differential pairs may be used to configure the differential input circuit 91. An amplifier 35C according to the present modification example is described in detail below.

Figure 13:
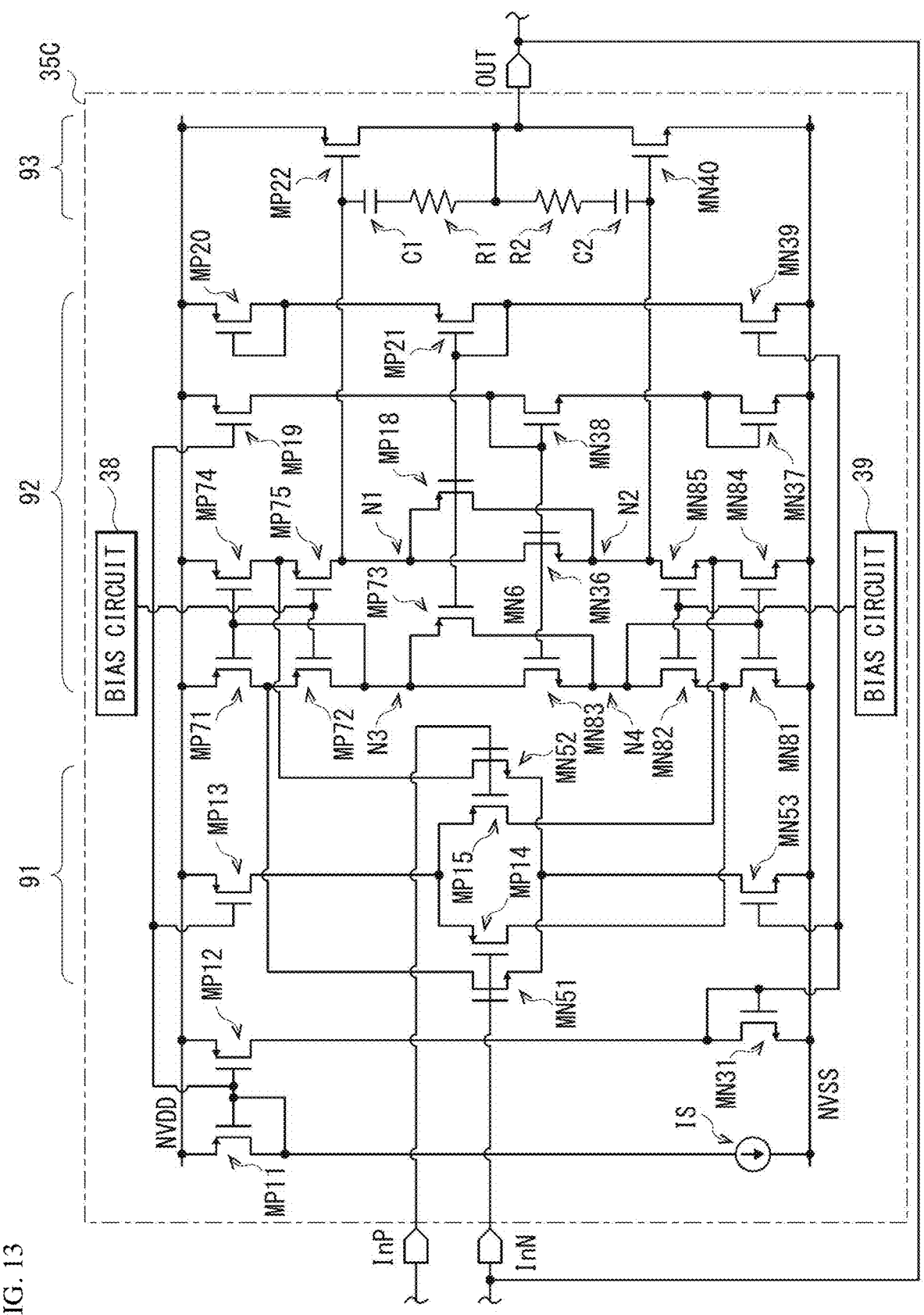
FIG. 13 is a circuit diagram illustrating a configuration example of an amplifier according to another modification example.

FIG. 13 illustrates a configuration example of the amplifier 35C. The amplifier 35C includes transistors MN51 to MN53, MP71 to MP75, and MN81 to MN85, and bias circuits 38 and 39. The transistors MN51 to MN53 and MN81 to MN85 are N-type MOS transistors, and the transistors MP71 to MP75 are P-type MOS transistors.

The transistor MN51 has a gate coupled to a negative input terminal InN of the amplifier 35C, a drain coupled to a drain of the transistor MP71 and a source of the transistor MP72, and a source coupled to a source of the transistor MN52 and coupled to a drain of the transistor MN53. The transistor MN52 has a gate coupled to a positive input terminal InP of the amplifier 35C, a drain coupled to a drain of the transistor MP74 and a source of the transistor MP75, and the source coupled to the source of the transistor MN51 and the drain of the transistor MN53. The transistor MN53 has agate coupled to the gate and the drain of the transistor MN31 and coupled to the drain of the transistor MP12 and the gate of the transistor MN39, the drain coupled to the sources of the transistors MN51 and MN52, and a source coupled to the ground node NVSS. The transistors MN51 and MN52 configure a differential pair.

The transistors MP13 to MP15 and MN51 to MN53 correspond to the differential input circuit 91 illustrated in FIG. 5.

The transistor MP71 has a gate coupled to the node N3, a source coupled to the power supply node NVDD, and the drain coupled to the drain of the transistor MN51 and the source of the transistor MP72. The transistor MP72 has a gate supplied with a bias voltage from the bias circuit 38, the source coupled to the drains of the transistors MP71 and MN51, and a drain coupled to the node N3. The transistor MP73 has a gate coupled to the gate and the drain of the transistor MP21 and coupled to the drain of the transistor MN39 and the gate of the transistor MP18, a source coupled to the node N3, and a drain coupled to the node N4. The transistor MN83 has agate coupled to the gate and the drain of the transistor MN38 and coupled to the drain of the transistor MP19 and the gate of the transistor MN36, a drain coupled to the node N3, and a source coupled to the node N4. The transistor MN82 has agate supplied with a bias voltage from the bias circuit 39, a drain coupled to the node N4, and a source coupled to drains of the transistors MN81 and MP14. The transistor MN81 has a gate coupled to the node N4, a drain coupled to the drain of the transistor MP14 and a source of the transistor MN82, and the source coupled to the ground node NVSS. The transistors MP71 and MP74 configure a current mirror circuit, and the transistors MN81 and MN84 configure a current mirror circuit.

The transistor MP74 has a gate coupled to the node N3, a source coupled to the power supply node NVDD, and the drain coupled to the drain of the transistor MN52 and the source of the transistor MP75. The transistor MP75 has a gate supplied with a bias voltage from the bias circuit 38, the source coupled to the drains of the transistors MP74 and MN52, and a drain coupled to the node N1. The transistor MN85 has agate supplied with a bias voltage from the bias circuit 39, a drain coupled to the node N2, and a source coupled to drains of the transistors MN84 and MP15. The transistor MN84 has a gate coupled to the node N4, the drain coupled to the drain of the transistor MP15 and the source of the transistor MN85, and a source coupled to the ground node NVSS.

Each of the bias circuits 38 and 39 is configured to generate a bias voltage.

The transistors MP71 to MP75, MN81 to MN85, MP18 to MP21, and MN36 to MN39, and the bias circuits 38 and 39 correspond to the bias circuit 92 illustrated in FIG. 5.

The power supply node NVDD corresponds to a specific example of a "first power supply node" in the present disclosure. The ground node NVSS corresponds to a specific example of a "second power supply node" in the present disclosure. The transistor MP22 corresponds to a specific example of a "first transistor" in the present disclosure. The transistor MN40 corresponds to a specific example of a "second transistor" in the present disclosure. The pair of the transistors MP14 and MP15 corresponds to a specific example of a "first differential transistor pair" in the present disclosure. The transistor MP14 corresponds to a specific example of a "first input transistor" in the present disclosure. The transistor MP15 corresponds to a specific example of a "second input transistor" in the present disclosure. The transistor MP17 corresponds to a specific example of a "third transistor" in the present disclosure. The transistor MN35 corresponds to a specific example of a "fourth transistor" in the present disclosure. The transistor MP18 corresponds to a specific example of a "fifth transistor" in the present disclosure. The transistor MN36 corresponds to a specific example of a "sixth transistor" in the present disclosure. The node N1 corresponds to a specific example of a "first node" in the present disclosure. The node N2 corresponds to a specific example of a "second node" in the present disclosure.

The pair of the transistors MN52 and MN51 corresponds to a specific example of a "second differential transistor pair" in the present disclosure. The transistor MN52 corresponds to a specific example of a "third input transistor" in the present disclosure. The transistor MN51 corresponds to a specific example of a "fourth input transistor" in the present disclosure. The transistor MP71 corresponds to a specific example of a "thirteenth transistor" in the present disclosure. The transistor MN81 corresponds to a specific example of a "fourteenth transistor" in the present disclosure. The transistor MP73 corresponds to a specific example of a "fifteenth transistor" in the present disclosure. The transistor MN83 corresponds to a specific example of a "sixteenth transistor" in the present disclosure. The node N3 corresponds to a specific example of a "third node" in the present disclosure. The node N4 corresponds to a specific example of a "fourth node" in the present disclosure.

Other Modification Examples

In addition, two or more of these modification examples may be combined.

2. Usage Example of Imaging Device

Figure 14:
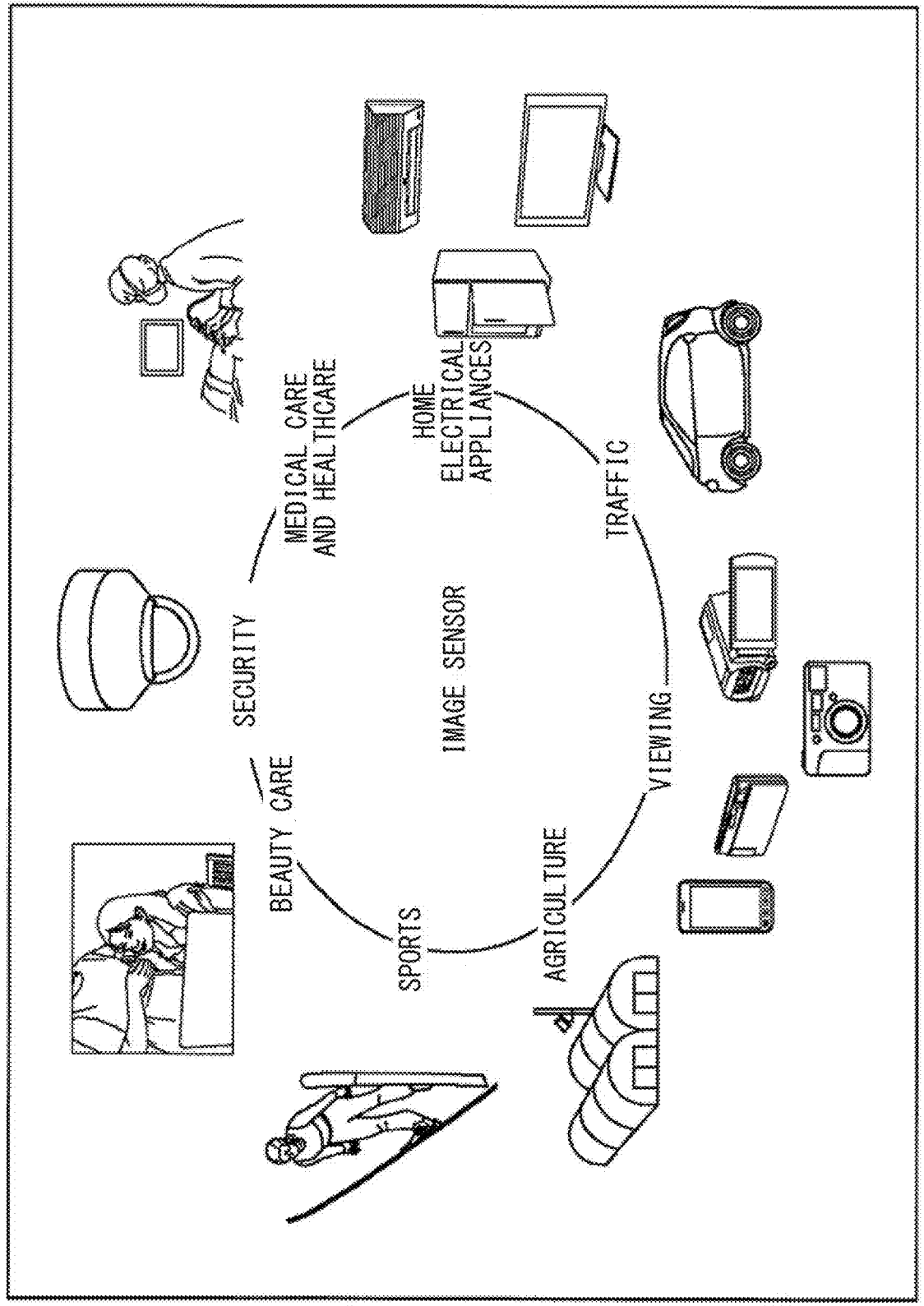
FIG. 14 is an explanatory diagram illustrating a usage example of the imaging device.

FIG. 14 illustrates a usage example of the imaging device 1 according to the embodiment described above. For example, the imaging device 1 described above is usable in a variety of cases of sensing light such as visible light, infrared light, ultraviolet light, and X-ray as follows.

- Devices that shoot images for viewing such as digital cameras and mobile devices having a camera function
- Devices for traffic use such as onboard sensors that shoot images of the front, back, surroundings, inside, and so on of an automobile for safe driving such as automatic stop and for recognition of a driver's state, monitoring cameras that monitor traveling vehicles and roads, and distance measuring sensors that measure vehicle-to-vehicle distance
- Devices for use in home electrical appliances such as televisions, refrigerators, and air-conditioners to shoot images of a user's gesture and bring the appliances into operation in accordance with the gesture
- Devices for medical care and health care use such as endoscopes and devices that shoot images of blood vessels by receiving infrared light
- Devices for security use such as monitoring cameras for crime prevention and cameras for individual authentication
- Devices for beauty use such as skin measuring devices that shoot images of skin and microscopes that shoot images of scalp
- Devices for sports use such as action cameras and wearable cameras for sports applications and the like
- Devices for agricultural use such as cameras for monitoring the states of fields and crops 3. Example of Application to Mobile Body The technology (the present technology) according to the present disclosure is applicable to a variety of products. For example, the technology according to the present disclosure may be achieved as a device mounted on any type of mobile body such as an automobile, an electric vehicle, a hybrid electric vehicle, a motorcycle, a bicycle, a personal mobility, an airplane, a drone, a vessel, or a robot.

Figure 15:
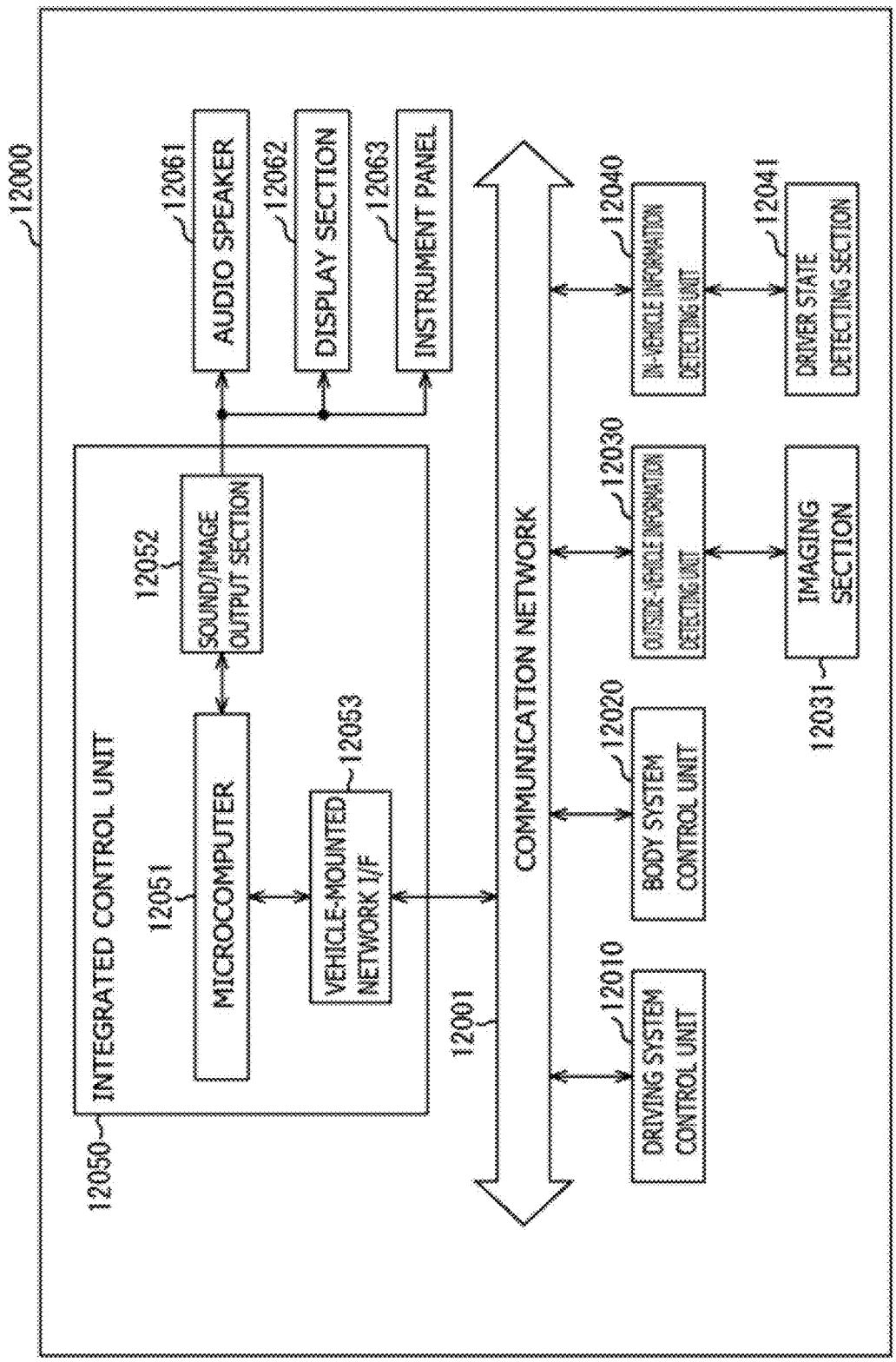
FIG. 15 is a block diagram depicting an example of schematic configuration of a vehicle control system.

FIG. 15 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 15, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 15, an audio speaker 12061, a display section 12062, and an instrument panel 12063 are illustrated as the output device. The display section 12062 may, for example, include at least one of an on-board display and a head-up display.

FIG. 16 is a diagram depicting an example of the installation position of the imaging section 12031.

In FIG. 16, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 16 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The description has been given hereinabove of one example of the vehicle control system to which the technology according to the present disclosure may be applied. The technology according to the present disclosure may be applied to the imaging section 12031 among the configurations described above. This makes it possible for the vehicle control system 12000 to enhance image quality of a captured image obtained by the imaging section 12031. This allows the vehicle control system 12000 to implement, with high accuracy, collision avoidance or shock mitigation for vehicles, a following driving function based on vehicle-to-vehicle distance, a vehicle speed maintaining driving function, a warning function of collision of the vehicle, a warning function of deviation of the vehicle from a lane, and the like.

Although the present technology has been described above with reference to some embodiments, the modification examples, and specific application examples thereof, the present technology is not limited to these embodiments and the like, and may be modified in a variety of ways.

For example, in the embodiment described above, the pixels P are disposed over the two semiconductor substrates 101 and 102, but this is not limitative. The pixels may be disposed on one semiconductor substrate, or may be disposed over three or more semiconductor substrates.

It is to be noted that the effects described herein are merely illustrative and non-limiting, and other effects may be included.

It is to be noted that the present technology may have the following configurations. According to the present technology having the following configurations, it is possible to enhance image quality of a captured image.

(1)

An imaging device including:
- a plurality of pixel circuits that each generates a pixel signal including a pixel voltage corresponding to an amount of received light, and performs AD conversion by comparing the pixel signal with a reference signal; and
- a reference signal generator including a signal generation circuit and a voltage follower circuit, the signal generation circuit that generates a voltage signal having a ramp waveform, and the voltage follower circuit that performs a voltage follower operation on the basis of the voltage signal to generate the reference signal, and supplies the reference signal to the plurality of pixel circuits.

(2)
The imaging device according to (1), in which
the voltage follower circuit includes an amplifier having a positive input terminal that is supplied with the voltage signal, a negative input terminal, an output terminal that is coupled to the negative input terminal and outputs the reference signal, and an output circuit coupled to the output terminal, and
the output circuit includes
a first transistor of a first electrical conductivity type having a source coupled to a first power supply node, a drain coupled to the output terminal, and a gate, and
a second transistor of a second electrical conductivity type having a source coupled to a second power supply node, a drain coupled to the output terminal, and a gate.

(3)
The imaging device according to (2), in which
the amplifier includes
a first differential transistor pair that is coupled to the positive input terminal and the negative input terminal, and generates a differential current including a first current and a second current,
a third transistor of the first electrical conductivity type that is provided in a first current path coupling the first power supply node and the second power supply node, and has a source coupled to the first power supply node, a gate, and a drain,
a fourth transistor of the second electrical conductivity type that is provided in the first current path, and has a source coupled to the second power supply node, a gate, and a drain,
a fifth transistor of the first electrical conductivity type that is provided between the third transistor and the fourth transistor in the first current path, and has a source coupled to a first node in the first current path, a drain coupled to a second node in the first current path, and a gate supplied with a first bias voltage, and
a sixth transistor of the second electrical conductivity type that is provided between the third transistor and the fourth transistor in the first current path, and has a drain coupled to the first node, a source coupled to the second node, and a gate supplied with a second bias voltage,
the amplifier controls a current flowing between the first node and the second node in the first current path, on the basis of the first current and the second current,
the gate of the first transistor is coupled to the first node, and
the gate of the second transistor is coupled to the second node.

(4)
The imaging device according to (3), in which
a current corresponding to the first current flows through the third transistor, and
a current corresponding to the second current flows through the fourth transistor.

(5)
The imaging device according to (3) or (4), in which
the amplifier includes
a seventh transistor of the second electrical conductivity type that has a drain, a gate coupled to the drain, and a source coupled to the second power supply node, and through which the first current flows,
an eighth transistor of the second electrical conductivity type that has a drain, a gate coupled to the drain, and the gate of the fourth transistor, and a source coupled to the second power supply node, and through which the second current flows,
a ninth transistor of the second electrical conductivity type that is provided in a second current path coupling the first power supply node and the second power supply node, and has a drain, a gate coupled to the gate and the drain of the seventh transistor, and a source coupled to the second power supply node, and
a tenth transistor of the first electrical conductivity type that is provided in the second current path, and has a drain, a gate coupled to the drain, and the gate of the third transistor, and a source coupled to the first power supply node.

(6)
The imaging device according to (3), in which
a current corresponding to the first current flows through the third transistor, and
a current having a predetermined current value including the second current flows through the fourth transistor.

(7)
The imaging device according to (3) or (6), in which
the amplifier further includes
an eleventh transistor of the second electrical conductivity type that is provided in a second current path coupling the first power supply node and the second power supply node, and has a drain, a gate, and a source coupled to the second power supply node, and through which a current having a predetermined current value including the first current flows, and
a twelfth transistor of the first electrical conductivity type that is provided in the second current path, and has a drain, a gate coupled to the drain, and the gate of the third transistor, and a source coupled to the first power supply node,
the first differential transistor pair includes
a first input transistor of the first electrical conductivity type that has a drain, and generates the first current, and
a second input transistor of the first electrical conductivity type that has a drain, and generates the second current,
the drain of the eleventh transistor is coupled to the drain of the first input transistor, and
the drain of the fourth transistor is coupled to the drain of the second input transistor.

(8)
The imaging device according to (3), in which
the amplifier further includes a second differential transistor pair that is coupled to the positive input terminal and the negative input terminal, and generates a differential current including a third current and a fourth current, and
the amplifier controls a current flowing between the first node and the second node on the basis of the first current, the second current, the third current, and the fourth current.

(9)
The imaging device according to (3) or (8), in which
the amplifier further includes
a thirteenth transistor of the first electrical conductivity type that is provided in a second current path coupling the first power supply node and the second power supply node, and has a source coupled to the first power supply node, a gate coupled to a third node in the second current path, and a drain,
a fourteenth transistor of the second electrical conductivity type that is provided in the second current path, and has a source coupled to the second power supply node, a gate coupled to a fourth node in the second current path, and a drain, a fifteenth transistor of the first electrical conductivity type that is provided between the thirteenth transistor and the fourteenth transistor in the second current path, and has a source coupled to the third node, a drain coupled to the fourth node, and a gate supplied with the first bias voltage, and a sixteenth transistor of the second electrical conductivity type that is provided between the thirteenth transistor and the fourteenth transistor in the second current path, and has a drain coupled to the third node, a source coupled to the fourth node, and a gate supplied with the second bias voltage, the first differential transistor pair includes a first input transistor of the first electrical conductivity type that has a drain, and generates the first current, and a second input transistor of the first electrical conductivity type that has a drain, and generates the second current.

the second differential transistor pair includes a third input transistor of the second electrical conductivity type that has a drain, and generates the third current, and a fourth input transistor of the second electrical conductivity type that has a drain, and generates the fourth current, the drain of the third transistor is coupled to the drain of the third input transistor, the drain of the fourth transistor is coupled to the drain of the second input transistor, the drain of the thirteenth transistor is coupled to the drain of the fourth input transistor, and the drain of the fourteenth transistor is coupled to the drain of the first input transistor.

This application claims the benefit of Japanese Priority Patent Application JP2020-052229 filed with the Japan Patent Office on Mar. 24, 2020, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. An imaging device comprising:

a plurality of pixel circuits that each generates a pixel signal including a pixel voltage corresponding to an amount of received light, and performs AD conversion by comparing the pixel signal with a reference signal; and a reference signal generator including a signal generation circuit and a voltage follower circuit, the signal generation circuit that generates a voltage signal having a ramp waveform, and the voltage follower circuit that performs a voltage follower operation on a basis of the voltage signal to generate the reference signal, and supplies the reference signal to the plurality of pixel circuits, wherein the voltage follower circuit includes an amplifier having a positive input terminal that is supplied with the voltage signal, a negative input terminal, an output terminal that is coupled to the negative input terminal and outputs the reference signal, and an output circuit coupled to the output terminal, wherein the output circuit includes a first transistor of a first electrical conductivity type having a source coupled to a first power supply node, a drain coupled to the output terminal, and a gate, and a second transistor of a second electrical conductivity type having a source coupled to a second power supply node, a drain coupled to the output terminal, and a gate, and wherein the amplifier includes a first differential transistor pair that is coupled to the positive input terminal and the negative input terminal, and generates a differential current including a first current and a second current.

2. The imaging device according claim 1, wherein the amplifier includes a third transistor of the first electrical conductivity type that is provided in a first current path coupling the first power supply node and the second power supply node, and has a source coupled to the first power supply node, a gate, and a drain, a fourth transistor of the second electrical conductivity type that is provided in the first current path, and has a source coupled to the second power supply node, a gate, and a drain, a fifth transistor of the first electrical conductivity type that is provided between the third transistor and the fourth transistor in the first current path, and has a source coupled to a first node in the first current path, a drain coupled to a second node in the first current path, and a gate supplied with a first bias voltage, and a sixth transistor of the second electrical conductivity type that is provided between the third transistor and the fourth transistor in the first current path, and has a drain coupled to the first node, a source coupled to the second node, and a gate supplied with a second bias voltage, the amplifier controls a current flowing between the first node and the second node in the first current path, on a basis of the first current and the second current, the gate of the first transistor is coupled to the first node, and the gate of the second transistor is coupled to the second node.

3. The imaging device according to claim 2, wherein a current corresponding to the first current flows through the third transistor, and a current corresponding to the second current flows through the fourth transistor.

4. The imaging device according to claim 2, wherein the amplifier includes a seventh transistor of the second electrical conductivity type that has a drain, a gate coupled to the drain, and a source coupled to the second power supply node, and through which the first current flows, an eighth transistor of the second electrical conductivity type that has a drain, a gate coupled to the drain, and the gate of the fourth transistor, and a source coupled to the second power supply node, and through which the second current flows, a ninth transistor of the second electrical conductivity type that is provided in a second current path coupling the first power supply node and the second power supply node, and has a drain, a gate coupled to the gate and the drain of the seventh transistor, and a source coupled to the second power supply node, and a tenth transistor of the first electrical conductivity type that is provided in the second current path, and has a drain, a gate coupled to the drain, and the gate of the third transistor, and a source coupled to the first power supply node.

5. The imaging device according to claim 2, wherein
a current corresponding to the first current flows through the third transistor, and
a current having a predetermined current value including the second current flows through the fourth transistor.

6. The imaging device according to claim 2, wherein
the amplifier further includes
an eleventh transistor of the second electrical conductivity type that is provided in a second current path coupling the first power supply node and the second power supply node, and has a drain, a gate, and a source coupled to the second power supply node, and through which a current having a predetermined current value including the first current flows, and
a twelfth transistor of the first electrical conductivity type that is provided in the second current path, and has a drain, a gate coupled to the drain, and the gate of the third transistor, and a source coupled to the first power supply node,
the first differential transistor pair includes a first input transistor of the first electrical conductivity type that has a drain, and generates the first current, and
a second input transistor of the first electrical conductivity type that has a drain, and generates the second current,
the drain of the eleventh transistor is coupled to the drain of the first input transistor, and
the drain of the fourth transistor is coupled to the drain of the second input transistor.

7. The imaging device according to claim 2, wherein
the amplifier further includes a second differential transistor pair that is coupled to the positive input terminal and the negative input terminal, and generates a differential current including a third current and a fourth current, and
the amplifier controls a current flowing between the first node and the second node on a basis of the first current, the second current, the third current, and the fourth current.

8. The imaging device according to claim 7, wherein
the amplifier further includes
a thirteenth transistor of the first electrical conductivity type that is provided in a second current path coupling the first power supply node and the second power supply node, and has a source coupled to the first power supply node, a gate coupled to a third node in the second current path, and a drain,
a fourteenth transistor of the second electrical conductivity type that is provided in the second current path, and has a source coupled to the second power supply node, a gate coupled to a fourth node in the second current path, and a drain,
a fifteenth transistor of the first electrical conductivity type that is provided between the thirteenth transistor and the fourteenth transistor in the second current path, and has a source coupled to the third node, a drain coupled to the fourth node, and a gate supplied with the first bias voltage, and
a sixteenth transistor of the second electrical conductivity type that is provided between the thirteenth transistor and the fourteenth transistor in the second current path, and has a drain coupled to the third node, a source coupled to the fourth node, and a gate supplied with the second bias voltage,
the first differential transistor pair includes
a first input transistor of the first electrical conductivity type that has a drain, and generates the first current, and
a second input transistor of the first electrical conductivity type that has a drain, and generates the second current,
the second differential transistor pair includes
a third input transistor of the second electrical conductivity type that has a drain, and generates the third current, and
a fourth input transistor of the second electrical conductivity type that has a drain, and generates the fourth current,
the drain of the third transistor is coupled to the drain of the third input transistor,
the drain of the fourth transistor is coupled to the drain of the second input transistor,
the drain of the thirteenth transistor is coupled to the drain of the fourth input transistor, and
the drain of the fourteenth transistor is coupled to the drain of the first input transistor.

* * * * *